(12) United States Patent　　(10) Patent No.: US 7,227,480 B2
Furuta et al.　　(45) Date of Patent: Jun. 5, 2007

(54) CURRENT STEERING TYPE SINGLE FLUX QUANTUM CIRCUIT

(75) Inventors: Futoshi Furuta, Kokubunji (JP); Kazuo Saito, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/335,475

(22) Filed: Jan. 20, 2006

(65) Prior Publication Data

US 2006/0290553 A1　　Dec. 28, 2006

(30) Foreign Application Priority Data

Jun. 22, 2005　(JP) ............................. 2005-181446

(51) Int. Cl.
*H03M 1/00* (2006.01)
(52) U.S. Cl. ...................... 341/133; 341/126
(58) Field of Classification Search ............... 341/133, 341/126, 155, 15
See application file for complete search history.

(56) References Cited

U.S. PATENT DOCUMENTS

| | | | | |
|---|---|---|---|---|
| 4,956,642 | A * | 9/1990 | Harada | 341/133 |
| 5,128,675 | A * | 7/1992 | Harada | 341/133 |
| 5,140,324 | A * | 8/1992 | Przybysz et al. | 341/133 |
| 5,818,373 | A * | 10/1998 | Semenov et al. | 341/133 |
| 6,157,329 | A * | 12/2000 | Lee et al. | 341/133 |
| 6,310,488 | B1 * | 10/2001 | Hasegawa et al. | 326/6 |
| 6,608,518 | B2 * | 8/2003 | Furuta et al. | 327/367 |
| 6,756,925 | B1 * | 6/2004 | Leung et al. | 341/133 |
| 7,038,604 | B2 * | 5/2006 | Hirano et al. | 341/133 |
| 7,095,227 | B2 * | 8/2006 | Tarutani et al. | 324/248 |
| 7,129,869 | B2 * | 10/2006 | Furuta et al. | 341/133 |

FOREIGN PATENT DOCUMENTS

JP　　2005-079663　　8/2003

OTHER PUBLICATIONS

Likharev, K.K. et al., "RSFQ Logic/Memory Family: A New Josephson-Junction Technology for Sub-Terahertz-Clock-Frequency Digital Systems", IEEE Transactions on Applied Superconductivity, vol. 1, No. 1, (Mar. 1991), pp. 3-28.
Przybysz, John X. et al., "Josephson Sigma-Delta Modulator for high Dynamic Range A/D Conversion", IEEE Transactions on Applied Superconductivity, vol. 3, No. 1, (Mar. 1993), pp. 2732-2735.
Lin, J.C. et al., "Design of SFQ-Counting Analog-to-Digital Converter", IEEE Transactions on Applied Superconductivity, vol. 5, No. 2, (Jun. 1995), pp. 2252-2259.

* cited by examiner

*Primary Examiner*—Linh Nguyen
(74) *Attorney, Agent, or Firm*—Reed Smith LLP; Stanley P. Fisher, Esq.; Juan Carlos A. Marquez, Esq.

(57) ABSTRACT

Disclosed is a single flux quantum circuit that uses a flux quantum as an information carrier, which generates a SFQ clock signal with little clock jitter and supplies the SFQ clock signal to a SFQ function circuit of the SFQ circuit, the SFQ function circuit is configured to include a current steering type single flux quantum circuit that is capable of concurrently achieving both a conversion function of converting a current signal into a SFQ signal and a comparator function of outputting a SFQ data signal in response to the amount of a to-be-compared current. At the same time, a SFQ clock signal oscillation circuit for generating a SFQ clock signal in response to the amount of DC voltage is formed.

4 Claims, 15 Drawing Sheets

CURRENT STEERING TYPE SINGLE FLUX QUANTUM CIRCUIT

CLAIM OF PRIORITY

The present application claims priority from Japanese application JP 2005-181446 filed on Jun. 22, 2005, the content of which is hereby incorporated by reference into this application.

FIELD OF THE INVENTION

The present invention relates to a single flux quantum circuit. In particular, the invention relates to means for supplying a high-frequency clock signal to the single flux quantum circuit and means for generating the clock signal.

BACKGROUND OF THE INVENTION

A single flux quantum (SFQ) circuit in which a single flux quantum ($\Phi_0$=h/2e=2.05×10$^{-15}$ Weber) is used as an information carrier is a superconducting circuit that is characterized by: ultrahigh-speed operation whose speed is in the order of several tens of gigahertz (10$^9$ Hz) or higher; and low-power property whose level is in the order of several microwatts (μW) per gate or lower. On the basis of the principles shown in IEEE Transaction Applied Superconductivity, Vol. 1, No. 1 (1991) p. 3, various kinds of logic gates have been developed so far, and circuits for practical use for which these logic gates are used in combination are widely being developed.

Applications of the SFQ circuit include an analog-to-digital converter. In order to make full use of high speed that is an advantage of the SFQ circuit, an oversampling method is adopted as a conversion method. Specifically, an analog signal is sampled with the frequency that is sufficiently higher than a band width, and the low bit accuracy (oversampling). Next, a sampling data signal is subjected to signal processing by use of a decimation filter, so that a digital signal with high accuracy is acquired in a required frequency band width.

As regards the oversampling method based on the SFQ circuit, the sigma-delta modulation is disclosed in the specification of U.S. Pat. No. 5,140,324 and in IEEE Transaction Applied Superconductivity, Vol. 3, No. 1, (1993), pp. 2732. In addition, the delta modulation is disclosed in IEEE Transaction Applied Superconductivity, Vol. 5, No. 2, (1995), pp. 2252.

In general, a SFQ circuit propagates a SFQ clock signal in the form of a SFQ pulse train to each SFQ function circuit so that the operation timing of the SFQ function circuit forming the SFQ circuit is aligned. Here, the SFQ function circuit is one of circuit elements constituting the SFQ circuit. The SFQ function circuit is a circuit having a unified series of workings, such as a comparator circuit, a reset-set flip-flop circuit, and an analog-to-digital converter, which will be described later. Each SFQ function circuit makes use of the supplied SFQ clock signal as a trigger signal so as to synchronize circuit operation with the SFQ clock signal. The same SFQ clock signal is supplied to a plurality of SFQ function circuits from one clock signal source and thereby it is possible to synchronize the operation of each SFQ function circuit with one SFQ clock signal.

Also in the case where the SFQ circuit is applied to the A/D converter, a SFQ clock signal having a frequency of several tens of gigahertz or higher is supplied, as an oversampling clock signal, to an analog-signal sampling circuit and a modulator, each of which includes a SFQ circuit.

To generate a SFQ clock signal, two kinds of methods have been proposed so far: a method that uses a semiconductor oscillator located outside a SFQ circuit; a method that uses a ring oscillator located inside a SFQ circuit.

FIG. 1A is a diagram illustrating a clock-signal supply circuit based on the former method; and FIG. 1B is a diagram illustrating as an example a dc-to-SFQ converter circuit used in the clock-signal supply circuit. In addition, FIG. 1C is a diagram illustrating each waveform in the circuit.

First of all, a semiconductor oscillator 101 generates a current clock signal 110 that is a sine wave or a rectangular wave. FIG. 1C shows a trapezoidal wave as an example. The generated current clock signal is transmitted through a coaxial cable, a microstrip line, or the like, to a SFQ circuit 102 kept in a cold-temperature environment. In the SFQ circuit 102, the current clock signal is converted into a SFQ clock signal 111 by a dc/SFQ converter 103.

In the dc/SFQ converter 103 shown in FIG. 1B, the current clock signal 110 is induced into a quantizing inductor 125 coupled magnetically to an input inductor 122. This causes a circular current 126 to flow clockwise through a superconducting loop that is formed of the quantizing inductor 125, a Josephson junction 123 and a Josephson junction 124. With the increase in current level of the inputted current clock signal 110, the circular current 126 induced on the superconducting loop side also increases in like manner. When the total amount of this circular current 126 and an electric current from the bias current source 121 becomes greater than a critical current value of the Josephson junction 123, the Josephson junction 123 changes to a voltage-state. As a result, an electric current flows from the Josephson junction 123 to the Josephson junction 124, and also flows to the output end of the converter. The electric current flowing toward the Josephson junction 124 becomes a counterclockwise circular current 127 permanently flowing through the superconducting loop that is formed of the Josephson junction 123, the Josephson junction 124 and the inductor 125. Because this circular current 127 flows in a direction opposite to the direction of the circular current 126 induced by the input current clock signal, the circular current 126 is lost in appearance, and accordingly an electric current flowing through the Josephson junction 123 becomes smaller than the critical current value. Therefore, the Josephson junction in a voltage-state returns to a zero-voltage-state again. The operation in which the Josephson junction changes from the zero-voltage-state to the voltage-state before returning to the zero-voltage-state again is hereinafter expressed as "a junction is switched". This switching of the junction is performed in several picoseconds, causing a SFQ pulse, which is a voltage pulse, to be generated at a node 128 connecting with the bias current source 121.

On the other hand, when a level of the input current clock signal turns from increasing to decreasing, the circular current 126 flowing clockwise decreases and the circular current 127 flowing counterclockwise begins to increase. If this circular current 127 exceeds the critical current value of the Josephson junction 124, the Josephson junction 124 is switched and consequently the circular current 127 is lost. At this point of time, the circuit returns to an initial state.

To be more specific, at the moment when a current level at the rising edge of the inputted current clock signal exceeds the threshold value of the converter, one SFQ pulse is generated. Accordingly, if the current clock signal 110 is inputted into the dc/SFQ converter 103, a SFQ pulse train whose interval is the same as a period of the inputted current clock signal is obtained. This SFQ pulse train is used as the SFQ clock signal 111.

The generated SFQ clock signal 111₁ is transmitted to a splitter circuit 105 through a Josephson transmission line 104₁, and is then copied to two SFQ clock signals 111₂, 111₃, which are transmitted to SFQ function circuits 106₁ and 106₂ through Josephson transmission lines 104₂ and 104₃, respectively. FIG. 1A is based on the assumption that the SFQ clock signal is divided into the two SFQ function circuits 106₁ and 106₂.

On the other hand, FIG. 2A is a diagram illustrating a clock-signal supply circuit based on the latter generation method for generating a SFQ clock signal; and FIG. 2B is a diagram illustrating each waveform in the circuit.

As shown in FIG. 2A, a dc/SFQ converter 201 converts a current trigger signal 220 supplied from the outside into a SFQ trigger signal 221₁ formed of one SFQ pulse. The SFQ trigger signal 221₁ is propagated through a Josephson transmission line 202, and is then supplied to a ring oscillator circuit 200 as a SFQ trigger signal 221₂. The ring oscillator circuit 200 starts oscillation operation by the SFQ trigger signal 221₂. The SFQ trigger signal 221₂ inputted from a confluence buffer 204 passes through a Josephson transmission line 203₁ as a SFQ trigger signal 221₃. When a SFQ trigger signal 221₄ output from the Josephson transmission line 203₁ passes through the splitter circuit 205, one SFQ clock signal 222₁ is newly copied, and the copied signal is then output from the ring oscillator circuit 200. The original SFQ trigger signal 221₄ is output from the splitter circuit 205 as a SFQ trigger signal 221₅, and passes through a Josephson transmission line 203₂, and is then output as a SFQ trigger signal 221₆. The SFQ trigger signal 221₆ returns to the confluence buffer 204, and is output as the SFQ trigger signal 221₃ again. Accordingly, the SFQ trigger signal 221₂ inputted into the ring oscillator circuit 200 passes around the Josephson transmission lines 203₁, 203₂, each of which is located in a ring shape. As a result, a SFQ pulse train is obtained from the splitter circuit 205. The SFQ pulse train obtained by the ring oscillator circuit 200 is used as the SFQ clock signal 222₁; and a SFQ clock signal 222₂ is transmitted to a splitter circuit 207 through a Josephson transmission line 206₁. In the splitter circuit 207, two SFQ clock signals 222₃, 222₄ are obtained. These SFQ clock signals 222₃ and 222₄ are supplied to SFQ function circuits 208₁ and 208₂ as SFQ clock signals 222₅ and 222₆ through Josephson transmission lines 206₂ and 206₃, respectively. An interval of the SFQ pulse train coincides with a period during which a SFQ passes through the Josephson transmission line 203. Accordingly, the length of the Josephson transmission line 203 is adjusted so as to generate a SFQ clock signal whose frequency is in the order of several tens of gigahertz.

SUMMARY OF THE INVENTION

In all SFQ circuits including an A/D converter, it is necessary to propagate a SFQ clock signal to each SFQ function circuit in correct timing. In particular, in the case of the A/D converter, the sampling time of an analog signal must be correct to improve the accuracy of the converter, and also to widen a frequency band of the converter. For this reason, it is required that a clock signal is supplied to the SFQ circuit at high speed and at the same time it has small clock jitter, in other words, small fluctuations in time intervals of a SFQ pulse.

In a method used in the prior art, a high-frequency SFQ clock signal that is generated by an oscillator of a semiconductor circuit or a ring oscillator circuit of a SFQ circuit is propagated through a Josephson transmission line and a splitter circuit, and then the SFQ clock signal is distributed among SFQ function circuits in the SFQ circuit. FIG. 3A illustrates an equivalent circuit of a Josephson transmission line. The Josephson transmission line is configured to include unit circuits 303 that are connected in series to one another. Each of the unit circuits 303 is formed of a Josephson junction 301, a bias current source 304, and an inductor 302. When a SFQ signal 320₁ enters from the input end, Josephson junctions 301₁, 301₂, 301₃ in the Josephson transmission line are successively switched from left to right. As a result, a SFQ moves in response to the switching. Eventually, the SFQ reaches the output end, and then a SFQ signal 320₂ is output. On the basis of the principles of operation, the Josephson transmission line propagates the SFQ signal from an input terminal to an output terminal.

The splitter circuit 307 shown in FIG. 3B is configured in a manner similar to that of the unit circuits 303 of the Josephson transmission line. The splitter circuit 307 is formed of a Josephson junction 301₂, two inductors 302₅, 302₆ and a bias current source 304₅. As a result of copying one SFQ signal 320₃ inputted through a unit circuit 303₄, two SFQ signals 320₄ and 320₅ are obtained through inductors 302₂ and 302₃ and unit circuits 303₆ and 303₇, respectively.

As shown in FIG. 3C, the bias current source 304 is often substituted with the bias resistor 305 and the bias voltage source 306. Incidentally, although the bias current source is an indispensable component for the Josephson junction, if it may be considered that the bias current is supplied to the Josephson junction, the bias current source is not referred to unless it is necessary.

However, the Josephson transmission line and the splitter circuit have a problem of clock jitter that increases with the further propagation of a SFQ pulse train, which is a clock signal, through the Josephson junction. The timing in which a Josephson junction is switched is determined by the time at which a SFQ enters a junction, and a phase state of the Josephson junction. As a result of switching of the Josephson junction caused by the last SFQ that has entered, this phase state fluctuates as much as a plasma oscillation period (about 0.1 ps) of the Josephson junction. In addition, the phase state fluctuates under the influence of thermal noises that are caused by a resistor component of the junction itself and by a bias resistor. For this reason, even if a SFQ pulse whose time intervals correctly coincide with one another is inputted into a Josephson junction, intervals of switching timing fluctuate. This is clock jitter that occurs in one Josephson junction.

While a SFQ pulse propagates through a Josephson transmission line, the clock jitter gradually grows larger. According to IEEE Transaction Applied Superconductivity, Vol. 11, No. 1 (2001) pp. 288, if a SFQ clock signal whose clock jitter is 0 ps is inputted into a Josephson transmission line constituted of junctions, the number of which is L, in a temperature environment of 4.2 K, the amount of clock jitter Δt of the SFQ clock signal at an output terminal is expressed by the following equation (1):

$$\Delta t = 0.2 \times \sqrt{L} \quad (1)$$

On the other hand, the relationship among the maximum allowable clock jitter of a sampling clock signal to be supplied to an A/D converter, the conversion bit accuracy N of AD conversion, and a band width $f_{BW}$ is expressed by the following equation (2):

$$\Delta t = 2 - \frac{N}{\pi f BW} \quad (2)$$

For example, on the assumptions that a target band $f_{BW}$ is 10 MHz, and that the conversion bit accuracy N is 14 bit, allowable clock jitter is calculated to be 2.0 ps by equation (2). On the assumptions that an A/D converter is formed of a SFQ circuit, and that a clock signal source does not include clock jitter, the number of Josephson junctions L is calculated to be 100 at the maximum by equation (1). Here, the Josephson junctions constitute the Josephson transmission line that connects between the clock signal source and the modulator. However, on the assumptions that the target band $f_{BW}$ is 10 MHz, and that the conversion bit accuracy N is 16 bit, the allowable clock jitter is 0.5 ps. Accordingly, the number of Josephson junctions L is limited to about 6.

If a ratio of the number of clock signal sources to the number of SFQ function circuits which requires a clock signal is 1:1 and the requested conversion accuracy is low, it is possible to avoid the influence of clock jitter by wiring the Josephson transmission line so that the length thereof is kept as short as possible. However, if there are a plurality of SFQ function circuits, it becomes necessary to place a splitter circuit in the middle of a transmission path. Accordingly, the length of the path gets longer. Therefore, it is very difficult to avoid the influence of clock jitter.

Examples of a conventional technology for reducing clock jitter occurring in a Josephson transmission line use a passive transmission line. As shown in IEEE Transaction Applied Superconductivity, Vol. 13, No. 2 (2002) pp. 535, this technology is a method that transmits a SFQ signal through a passive transmission line, i.e., a microstrip line. Because clock jitter does not occur on a strip line in principle, this method is effective for long-distance transmission of a SFQ clock signal.

However, this transmission method requires a driver circuit for transmitting a SFQ pulse coming from a SFQ function circuit to a microstrip line, and a receiver circuit for obtaining the SFQ signal from the microstrip line. These circuits have a structure similar to that of the Josephson transmission line, and have junctions, the number of which is from one to three. Moreover, it is difficult to implement the splitter circuit of the SFQ signal only by the microstrip line, and accordingly it is necessary to additionally provide a receiver circuit, a splitter circuit and a driver circuit. Therefore, even if the amount of clock jitter in the microstrip line is 0, clock jitter occurring in the whole transmission system is equivalent to clock jitter of a Josephson transmission line, the number of junctions of which is about from 3 to 10.

Further, a clock signal itself that is generated by a ring oscillator circuit contains clock jitter. It is because a SFQ trigger signal travels through a ring of the Josephson transmission line many times. Therefore, it is not appropriate to use a ring oscillator circuit as means for generating a high-frequency and high-accuracy clock signal.

For the above reasons, it is difficult to reduce the influence of clock jitter by the conventional method for supplying a clock signal in a SFQ circuit.

The present invention has been made to solve the above problems. According to the present invention, there is provided a current steering type single flux quantum circuit that is capable of achieving, at the same time, both a function of converting a current signal into a SFQ signal and a comparator function of outputting a SFQ data signal in response to the amount of to-be-compared current. The current steering type single flux quantum circuit is used as a main circuit element of a SFQ function circuit. As a result, the SFQ function circuit eliminates the need for a propagated SFQ clock signal. In addition, if a high-frequency SFQ clock signal is required, an SFQ clock signal oscillation circuit is formed which directly generates a SFQ clock signal in response to the amount of DC voltage is formed.

DESCRIPTION OF THE PREFERRED EMBODIMENT

Figure 4A:
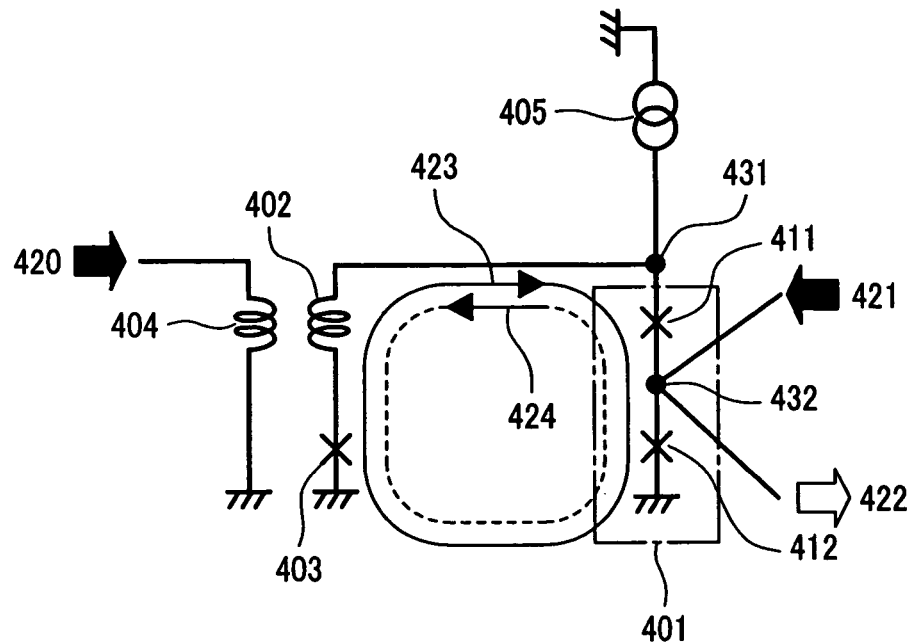
FIGS. 4A and 4B are equivalent circuit diagrams illustrating two different types of current steering type single flux quantum circuits according to the present invention.

FIG. 4A is a diagram illustrating a current steering type single flux quantum circuit that is proposed in the present invention. This circuit includes: a comparator 401 formed of a pair of junctions, Josephson junctions 411 and 412; and a generation circuit for generating a SFQ signal. This generation circuit includes a series circuit formed of a quantizing inductor 402 connected to the comparator 401 and a quantizing junction 403, and an input inductor 404 that is magnetically coupled to the quantizing inductor 402. The principles of the current steering type single flux quantum circuit are to achieve at a time both of: a generation function of generating a SFQ signal in synchronization with the rising edge of a current clock signal 420 that is applied to the input inductor 404; and a comparator function of making an electric current comparison on the timing of the generated SFQ signal. Because the SFQ signal generation circuit is directly-connected to the comparator, a Josephson transmission line is not used at all. Accordingly, no clock jitter occurs.

The operation of the current steering type single flux quantum circuit will be described in detail below. The comparator 401 is formed of the pair of junctions constituted of the two Josephson junctions 411 and 412 connected in series to each other. One end 431 of the comparator 401 is connected to the bias current source 405 and the other end is grounded. A to-be-compared current 421 which is a target to be compared is inputted into a node 432 between the two Josephson junctions so as to obtain from the node a SFQ data signal 422 that is the result of the comparison. A threshold value of the comparator 401 is determined by critical current values of the Josephson junctions 411 and 412 constituting the comparator 401 and a bias current supplied from the bias current source 405. One end of the series circuit formed of the quantizing inductor 402 and the quantizing junction 403 is connected to a node 431 between one end of the pair of junctions 401 and the bias current source 405; and the other end of the series circuit is grounded. A current clock signal 420 is applied to the input inductor 404 that is magnetically coupled to the quantizing inductor 402.

Figure 1A:
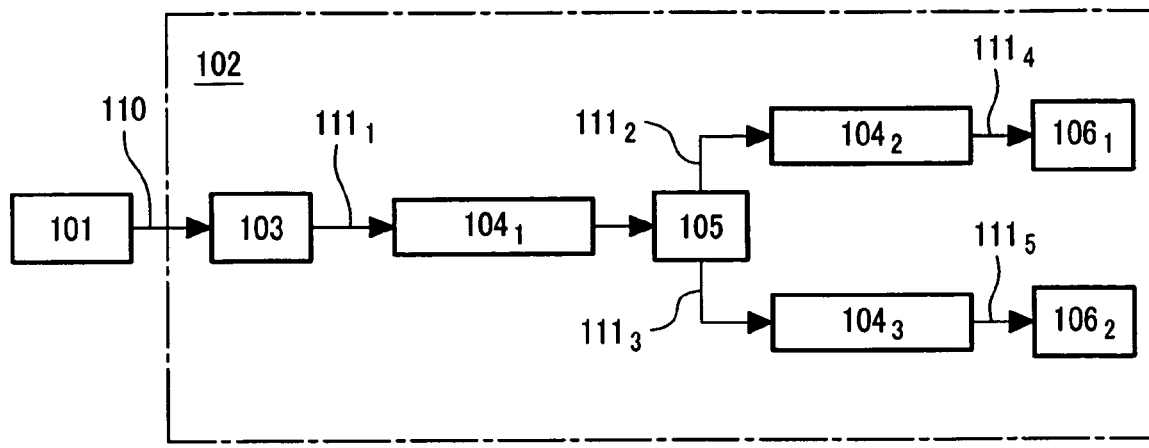
FIGS. 1A, 1B and 1C are diagrams each illustrating a method for supplying a single flux quantum clock signal.
Figure 1B:
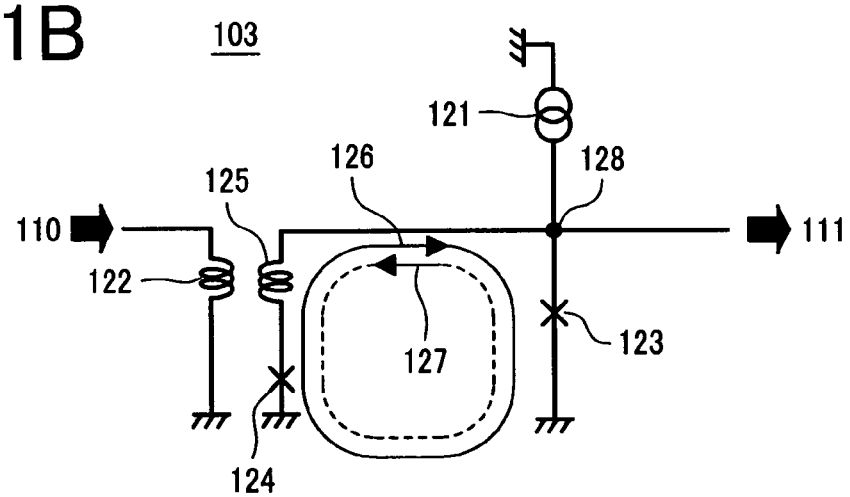
Figure 1C:
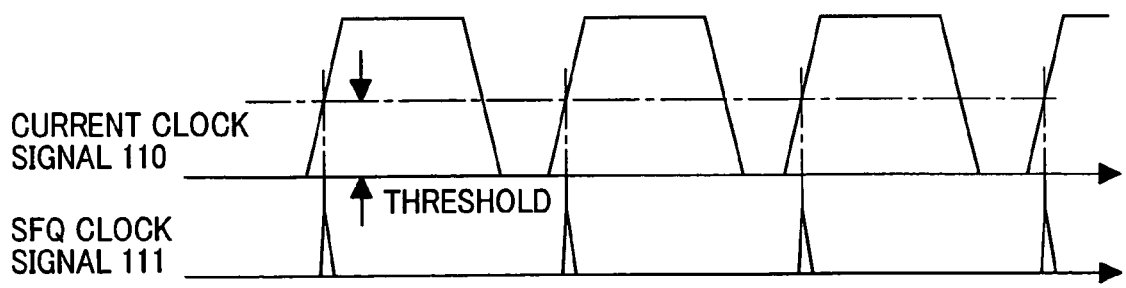
Figure 2A:
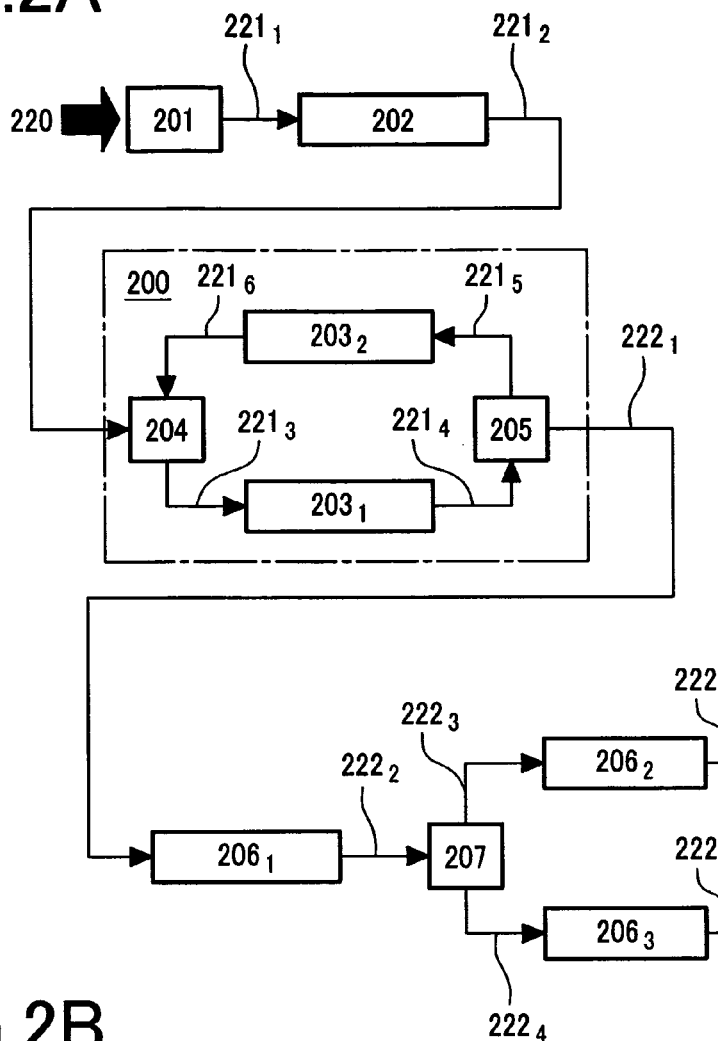
FIGS. 2A and 2B are diagrams each illustrating a method for generating and supplying a single flux quantum clock signal.
Figure 2B:
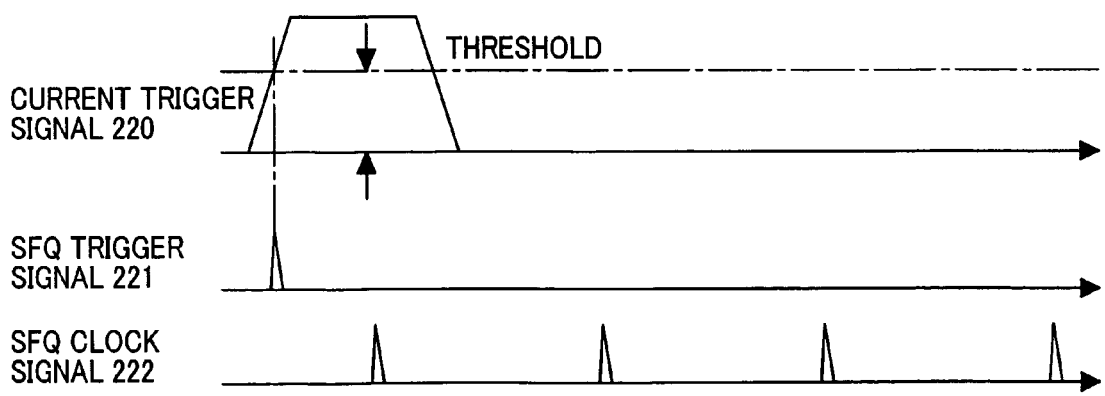
Figure 3A:
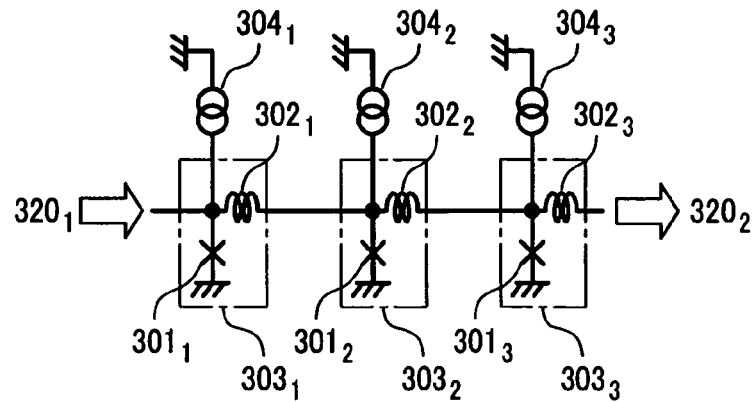
FIGS. 3A, 3B and 3C are equivalent circuit diagrams illustrating a Josephson transmission line and a splitter circuit.
Figure 3B:
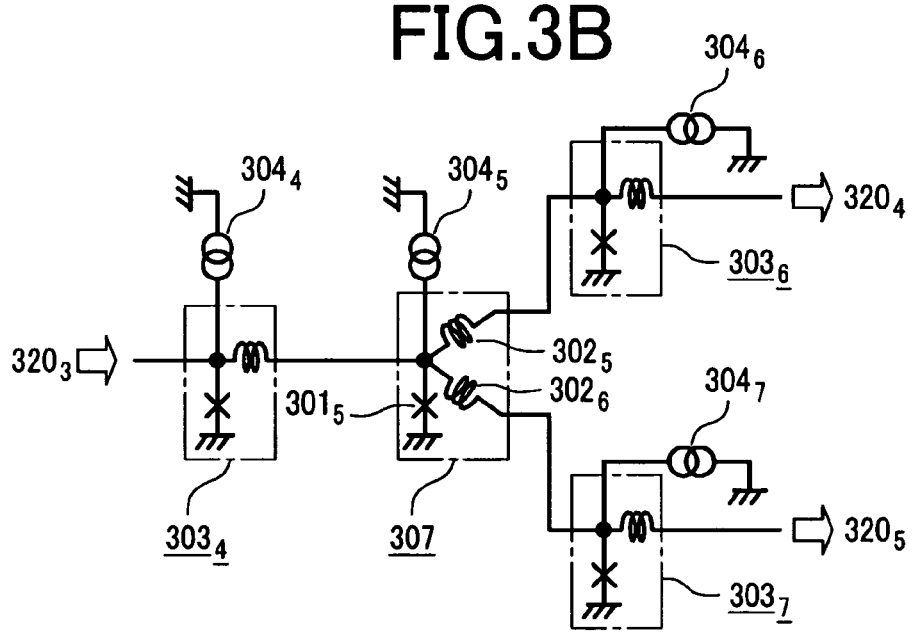
Figure 3C:
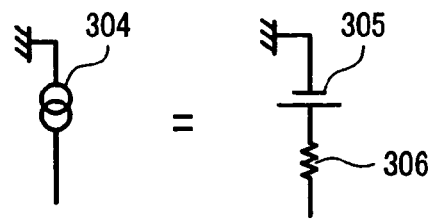

The quantizing inductor 402, the quantizing junction 403, the input inductor 404, and the comparator 401 have a function of generating a SFQ clock signal from the current clock signal 420 to be inputted. A current clock signal as shown in FIG. 1C or FIG. 2B (more specifically, a current signal equivalent to, for example, a rectangular wave including a sine wave or harmonics thereof) are inputted into the input inductor 404. This current clock signal is induced in the quantizing inductor 402 that is magnetically coupled to the input inductor 404. As a result, a circular current 423 flows in a clockwise direction through a superconducting loop that is formed of the quantizing inductor 402, the comparator 401 and the quantizing junction 403. With the increase in electric current level of the inputted current clock signal 420, the circular current 423 induced on the superconducting loop side also increases in like manner. If this circular current becomes equivalent to a circular current that is equivalent to one SFQ, either of the two Josephson junctions 411, 412 which constitute the comparator is switched. This means that one SFQ is supplied to the comparator 401. In addition, by switching either the Josephson junction 411 or 412, the circular current 423 is lost. When the current level of the current clock signal 420 turns from increasing to decreasing, a circular current flowing in a counterclockwise direction, as indicated with a broken line, is generated in the superconducting loop. As a result of the decrease in electric current level of the current clock signal, if the circular current exceeds a threshold value of the quantizing junction 403, the quantizing junction 403 is switched, causing the circular current to be lost. At this point of time, the circuit returns to an initial state. As a result, the current steering type single flux quantum circuit provides a function of generating one SFQ from an input clock current signal without using a Josephson transmission line, and directly supplying the SFQ to the comparator 401.

Here, how the comparator 401 operates will be described. When flowing into the node 432, the to-be-compared current 421 is divided into an electric current flowing toward the Josephson junction 412 and an electric current flowing toward the Josephson junction 411, the quantizing inductor 402, and the quantizing junction 403. Therefore, even if the Josephson junction 411 has exactly the same properties as those of the Josephson junction 412, the electric current flowing toward the Josephson junction 412 becomes larger than that flowing toward the Josephson junction 411. Moreover, a bias current generated by the bias current source 405 flows into the Josephson junction 411 and the Josephson junction 412 in a superposed manner. At the Josephson junction 411, the bias current flows in the direction opposite to the divided to-be-compared current 421. Therefore, on the assumption that the to-be-compared current 421 is larger than the threshold value of the comparator, the Josephson junction 412 is switched in a process in which the circular current 423 increases, and consequently a SFQ signal is output from an output terminal as the SFQ data signal 422.

On the other hand, if the to-be-compared current 421 is smaller than the threshold value of the comparator 401, the SFQ data signal 422 must be prevented from being output. For this purpose, the Josephson junction 411 needs to be switched for the circular current 423. In order to do so, each junction has only to be created so that a critical current of the Josephson junction 411 becomes smaller than that of the Josephson junction 412. To be more specific, the junction area of the Josephson junction 411 has only to be reduced. Furthermore, with the objective of adjusting the properties, it is desirable to adjust the bias current by use of the bias current source 405.

In practice, it is not possible to produce the Josephson junctions 411, 412 so that they have exactly the same properties. Accordingly, by designing the Josephson junctions 411, 412 so that a critical current of the Josephson junction 411 becomes smaller than that of the Josephson junction 412, and then by adjusting the bias current by use of the bias current source 405, it is possible to properly select a threshold value of the comparator 401 to operate the comparator 401.

Figure 4B:
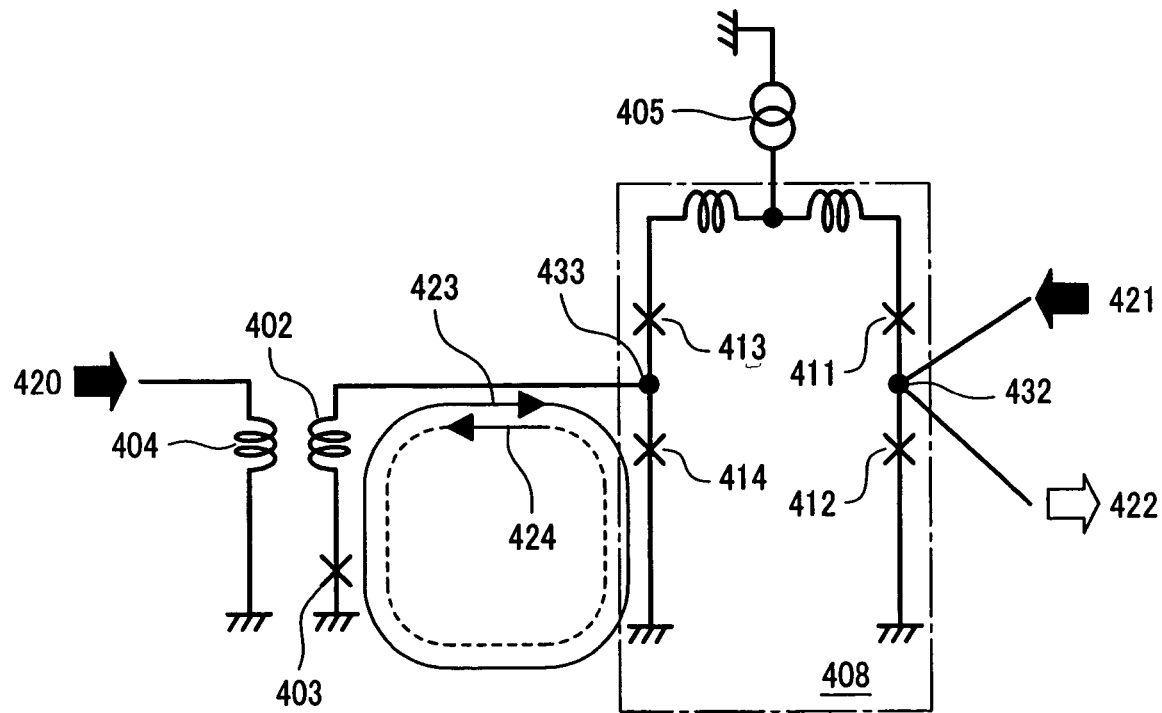

FIG. 4B is a diagram illustrating an embodiment in which the comparator 401 of the current steering type single flux quantum circuit described in FIG. 4A is replaced with a four-junction balanced comparator 408. The comparator 408 includes a pair of junctions, Josephson junctions 413 and 414, in addition to the pair of junctions, Josephson junctions 411 and 412. One end of each pair of junctions is grounded. The other end of each pair of junctions is connected to the bias current source 405 with the other end of one pair of junctions being coupled to the other end of the other pair of junctions through inductors. The to-be-compared current 421 is inputted into a node 432 between the Josephson junctions 411 and 412. One end of a series circuit formed of the quantizing inductor 402 and the quantizing junction 403 is connected to a node 433 between the Josephson junctions 413 and 414; and the other end of the series circuit is grounded. A current clock signal 420 is applied to the input inductor 404 that is magnetically coupled to the quantizing inductor 402.

At the rising edge of the current clock signal 420, the circular current 423 flows into the quantizing inductor 402, and consequently a SFQ pulse whose period coincides with that of the current clock signal 420 is supplied to the node 433 between the pair of junctions constituted of the Josephson junctions 413 and 414 of the comparator 408. As a result, the Josephson junction 414 is switched, and thereby the SFQ pulse is supplied to the pair of junctions constituted of the Josephson junctions 411 and 412. At this time, if the to-be-compared current 421 does not exceed a threshold value of the comparator 408, the Josephson junction 411 is switched, and accordingly the SFQ data signal 422 is not output to an output terminal. On the other hand, if the to-be-compared current 421 exceeds the threshold value, the Josephson junction 412 is switched, and accordingly the SFQ data signal 422 is output to the output terminal. In addition, at the falling edge of the current clock signal 420, the counterclockwise circular current 424 increases. However, because the quantizing junction 403 is switched, the circular current 424 is lost, and the circuit returns to the initial state.

In the case of a SFQ circuit including a plurality of SFQ function circuits such as the comparators 401, 408, an input inductor of the current steering type single flux quantum circuit of each of the SFQ function circuits is connected in series or in parallel so as to supply a SFQ clock signal corresponding to one input current clock signal to each of the SFQ function circuits. The input current clock signal is supplied to input inductors of all of the connected SFQ function circuits. Accordingly, the circular current corresponding to the current clock signal has only to be concurrently supplied to all of the input inductors. As a result, the operation of all of the SFQ function circuits can be synchronized with the one input current clock signal. As a more specific example, a reset-set flip-flop circuit will be described with reference to FIGS. 13 and 14.

Figure 5:
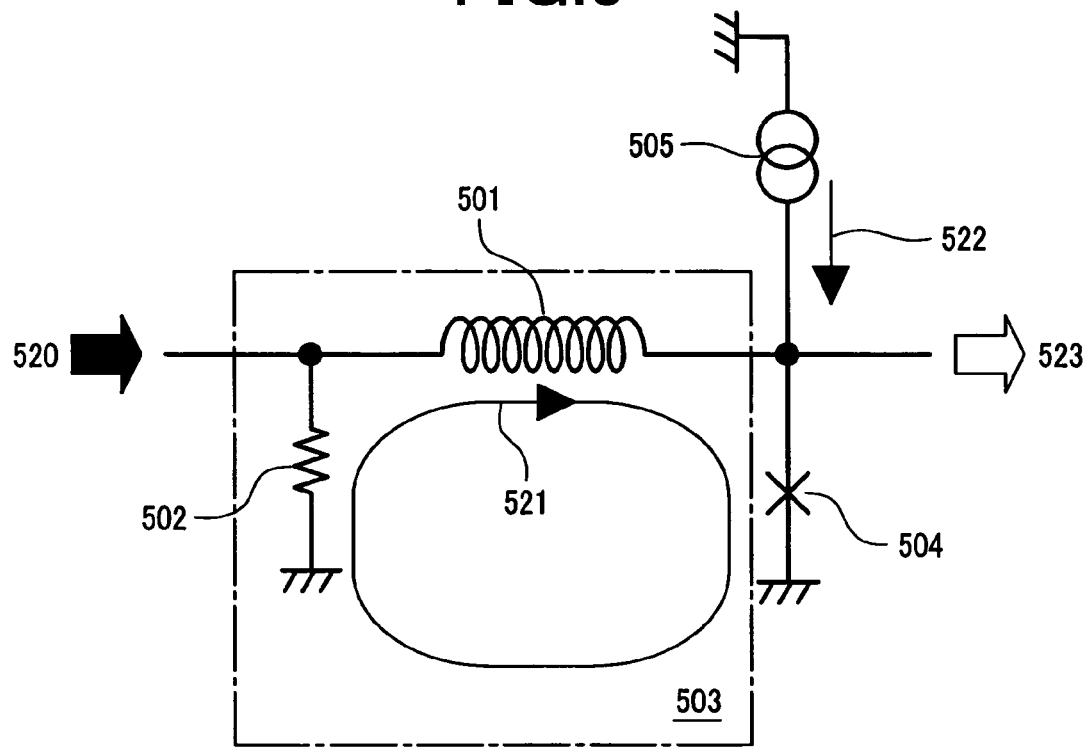
FIG. 5 is an equivalent circuit diagram illustrating a clock signal oscillation circuit according to the present invention.

Next, how to generate a high-frequency clock will be described. FIG. 5 is a diagram illustrating a clock signal generation circuit. This circuit includes: an integration circuit 503 formed of an integrating inductor 501 and an integrator resistor 502; a quantizing junction 504; and a bias current source 505. Operation of the clock signal generation circuit will be described below.

A specified DC voltage 520 is applied to the integrator resistor 501. This DC voltage is then integrated by the integration circuit 503 formed of the integrating inductor 501 and the integrator resistor 502. The result of the integration is reflected in the circular current 521 flowing into the inductor 501. Then, the circular current 521 flows into the quantizing junction 504. In the integration process of the inputted DC voltage, an integration value, i.e., a level of the circular current 521 increases. At a point of time when the total amount of the bias current 522 supplied from the bias current source 505 and the circular current 521 exceeds a critical current value of the quantizing junction 504, the quantizing junction 504 is switched, which causes the SFQ signal 523 to be output. At the same time, the switching of the quantizing junction 504 causes the circular current equivalent to one SFQ to be fed back to the integration circuit 503, resulting in a decrease in the circular current 521 of the integrating inductor 501. At this point of time, the circular current 521 of the integrating inductor 501 becomes lower than the critical current value of the quantizing junction 504. Accordingly, the operation returns to the integration of a DC voltage. As a result, the alternation of the integration operation which increases the circular current and the switching operation of the junction which decreases the circular current brings the circuit into a balanced state. The relationship between a period T of the switching operation and an inputted DC voltage $V_{IN}$ is expressed by equation (3) as follows:

$$T = \frac{\phi_0}{V_{IN}} \quad (3)$$

Since the clock signal oscillation circuit shown in FIG. 5 generates a clock signal with the quantizing junction 504, i.e., one Josephson junction, theoretical clock jitter which occurs is equivalent to one Josephson junction. This clock signal oscillation circuit can make the clock jitter smaller than that of a ring oscillator circuit that uses a Josephson transmission line constituted of many junctions.

There are three methods for acquiring a clock signal from this clock signal oscillation circuit. A first method is a method in which the circular current 521 flowing into the integrating inductor 501 is used as a current clock signal. When the inputted DC voltage 520 is integrated, the circular current 501 increases, whereas the feedback from the Josephson junction 504 causes the circular current 501 to decrease. The alternation of the above operation brings the circuit into a balanced state. To be more specific, because the circular current 521 of the integrating inductor 501 periodically increases and decreases, the circular current 521 behaves in the same manner as the current clock signal 110 shown in FIG. 1C. By magnetically coupling the integrating inductor 501 to the quantizing inductor 402 as the input inductor 404 of the current steering type single flux quantum circuit described in FIG. 4, it is possible to induce the current clock signal (the circular current 521) generated in the clock signal oscillation circuit shown in FIG. 5 in the quantizing inductor 402 of the current steering type single flux quantum circuit shown in FIG. 4.

In this case, as is the case with the comparator 401 of the current steering type single flux quantum circuit shown in FIG. 4, the quantizing inductor 402 of the current steering type single flux quantum circuit included in each of the plurality of SFQ function circuits is magnetically coupled to one integrating inductor 501. This makes it possible to synchronize operation of the plurality of SFQ function circuits with the current clock signal 521 of the clock signal oscillation circuit.

A second method for acquiring a clock signal from the clock signal oscillation circuit is a method in which a SFQ pulse obtained from a quantizing junction is directly used. A SFQ pulse train having intervals given by the equation (3) is acquired from the quantizing junction. This SFQ pulse train is used as a SFQ clock signal. If the influence of clock jitter is not taken into consideration, the Josephson transmission line is connected to an output terminal of the clock signal oscillation circuit so as to transmit the SFQ clock signal to the SFQ function circuit.

Figure 6:
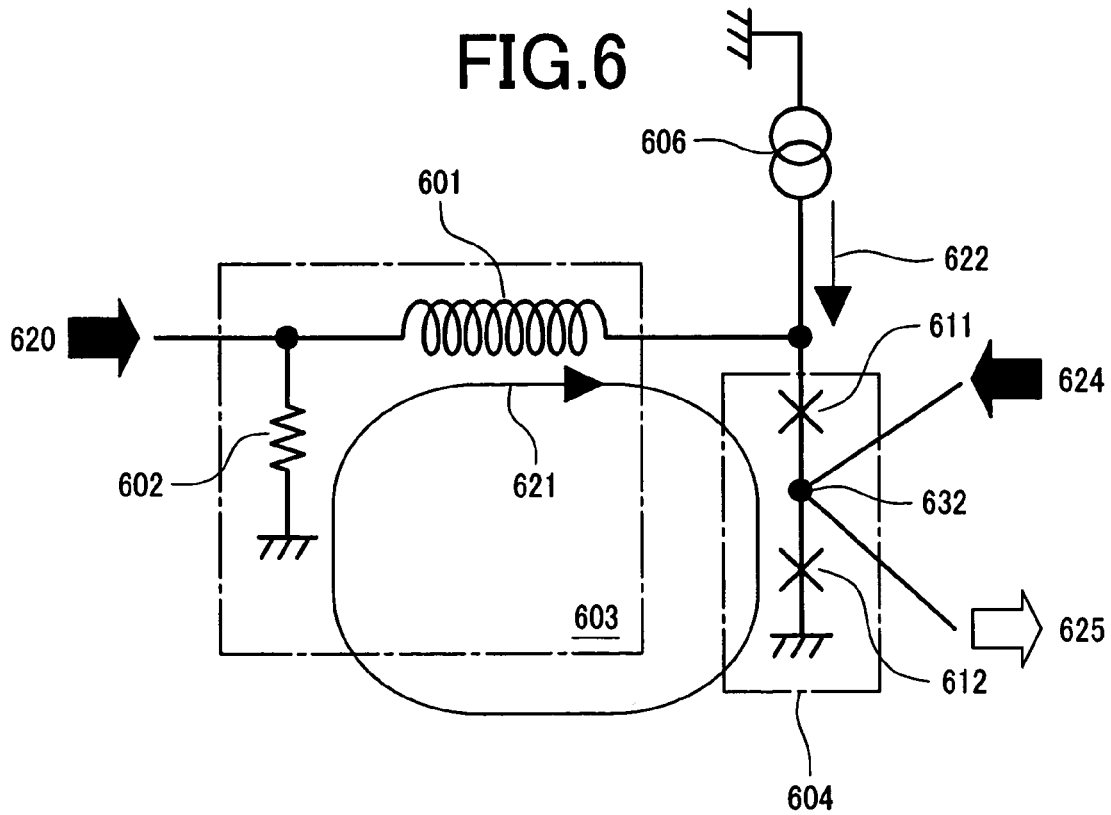
FIG. 6 is an equivalent circuit diagram illustrating a circuit in which a clock signal oscillation circuit is combined with a current steering type single flux quantum circuit according to the present invention.

A third method is a method in which a SFQ clock signal is propagated in the SFQ function circuit without using the Josephson transmission line so that the influence of clock jitter may be minimized. A circuit shown in FIG. 6 is an example of the third method. In this circuit, the quantizing junction 504 in the circuit shown in FIG. 5 is replaced with a comparator 604 in which two Josephson junctions 611, 612 are connected to each other in series. The circuit shown in FIG. 6 is configured by replacing the generation circuit for generating a SFQ signal shown in FIG. 4 with a clock signal oscillation circuit. As described above, the generation circuit includes: the series circuit formed of the quantizing inductor 402, and the quantizing junction 403, of the current steering type single flux quantum circuit; and the input inductor 404 that is magnetically coupled to the quantizing inductor 402. Thus, the circuit in FIG. 6 has a function of generating a clock signal, and a comparator function.

The circuit shown in FIG. 6 operates as below. An inputted DC voltage 620 is integrated by an integration circuit 603 that is formed of an integrating inductor 601 and an integrator resistor 602. The integrated DC voltage. 620 is then reflected in a circular current 621 flowing into an integrating inductor 601. An integration value, namely, a value of the circular current 621, increases with the lapse of time. If the total amount of the value of the circular current 621 and the bias current 622 exceeds a current value equivalent to one SFQ, either of the two Josephson junctions 611, 612 constituting the comparator 604 is switched. This means that one SFQ signal is supplied to the pair of junctions constituting the comparator 604. As a result of this switching operation, a circular current equivalent to one SFQ is fed back to the integration circuit 603. This operation is the same as that described with reference to FIG. 5 relating to the circular current 521 of the integrating inductor 501. To be more specific, it becomes possible to periodically supply SFQ to the comparator 604 by the integration operation of the integrating inductor 601 and by the switching operation and the feedback operation of the pair of junctions constituted of the Josephson junctions 611, 612.

On the other hand, depending on the amount of the to-be-compared current 624 that is inputted into a node 632 between the two Josephson junctions 611 and 612 of the comparator 604, a method of determining either of the Josephson junctions 611, 612, which is to be switched when a SFQ pulse is supplied to the comparator 604, is the same as the method that uses the comparator shown in FIG. 4. To be more specific, if the to-be-compared current 624 is larger than the threshold value of the comparator 604, the Josephson junction 612 is switched, which causes a SFQ data signal 625 to be output. If the to-be-compared current is smaller than the threshold value of the comparator, the Josephson junction 611 is switched, and accordingly the SFQ data signal 625 is not output. This is how to achieve the comparator operation. The above-mentioned circuit operation makes it possible to achieve both the generation of a high-frequency SFQ clock signal and the comparator operation at the same time.

As understood even from the above example, in the SFQ circuit, all of the SFQ function circuits each requiring a SFQ clock signal have a built-in comparator for comparing a current signal. For example, a modulator forming an A/D converter includes, in its circuit, one or more comparators that use, as a to-be-compared current, an analog signal or an electric current of a feedback loop. In addition, a flip-flop circuit includes a storage loop for storing state variables, and also includes one or more comparators that use, as a to-be-compared current, a circular current flowing in the loop. In other words, the SFQ clock signal is always inputted into the comparator circuit in the SFQ function circuit. Therefore, supplying the SFQ clock signal to each SFQ function circuit of the SFQ circuit is equivalent to supplying the SFQ clock signal to the comparator of each SFQ function circuit.

Applications of the present invention will be described with reference to preferred embodiments below. These embodiments are merely examples in which the present invention is applied, and accordingly the present invention is not limited by these embodiments.

First Embodiment

Figure 7:
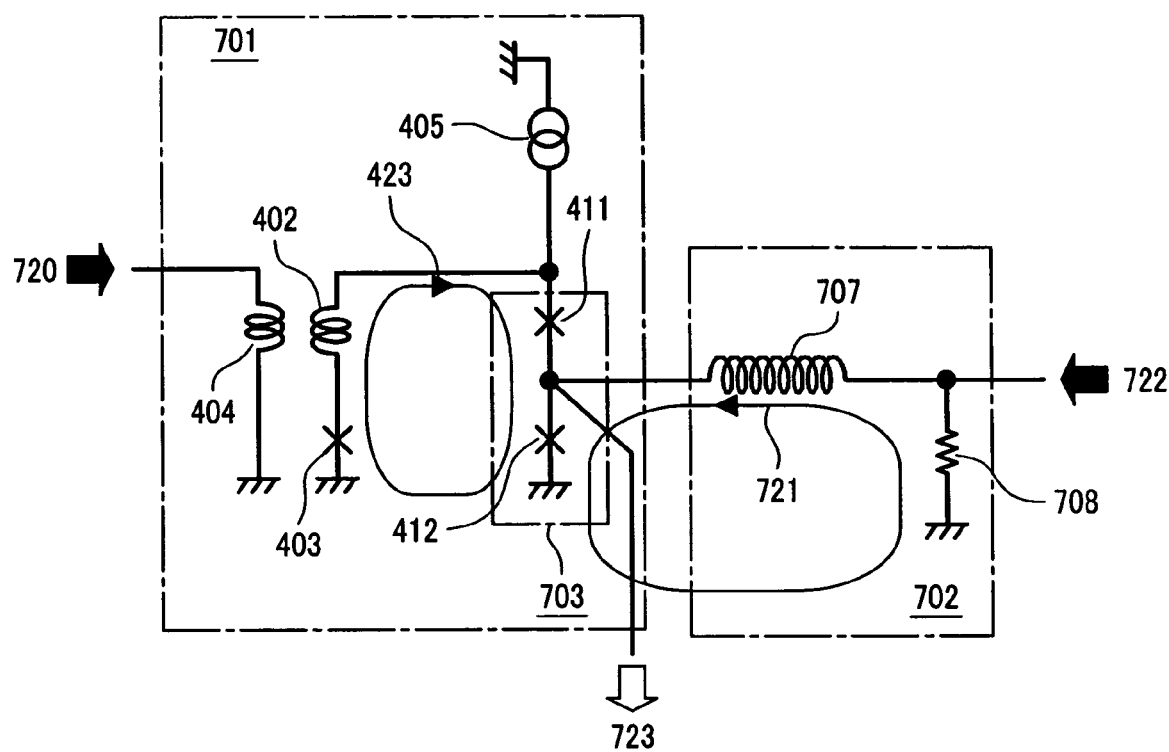
FIG. 7 is an equivalent circuit diagram illustrating a single flux quantum sigma-delta modulation circuit according to a first embodiment of the present invention.

FIG. 7 is a diagram illustrating an embodiment in which a current steering type single flux quantum circuit proposed in the present invention is applied to a modulator of an oversampling A/D converter. A circuit shown in FIG. 7 comprises a current steering type single flux quantum circuit 701 according to the present invention and an analog-signal integration circuit 702.

An analog voltage signal 722 which is an analog signal to be converted is integrated by an analog-signal integration circuit 702 that is formed of an integrating inductor 707 and an integrator resistor 708. The result of the integration is reflected in a circular current 721 flowing through the integrating inductor 707. This circular current 721 is inputted, as a to-be-compared current, into a comparator 703 in the current steering type single flux quantum circuit 701. On the other hand, as described with reference to FIG. 4, a current clock signal 720 supplied to the current steering type single flux quantum circuit 701 causes a SFQ pulse whose period coincides with that of the current clock signal 720 to be supplied to the comparator 703. If the circular current 721 of the analog-signal integration circuit 702, which is the to-be-compared current, does not exceed a threshold value of the comparator 703, the Josephson junction 411 of the comparator 703 is switched, and consequently the SFQ data signal 723 is not output to an output terminal. On the other hand, if the circular current 721 exceeds the threshold value, the Josephson junction 412 is switched, which causes the SFQ data signal 723 to be output to the output terminal. If the SFQ data signal 723 is not output from the output terminal within a period of time that is equivalent to one period of the current clock signal 720, then the output is defined as digital data "0". If the SFQ data signal 723 is output, the output is defined as digital data "1".

In addition, as a result of switching of the Josephson junction 412, an electric current I equivalent to one SFQ, which is defined by equation (4) mentioned below, flows into the integrating inductor 707 in the direction opposite to that of the circular current 721, resulting in a decrease in the circular current 721 of the integrating inductor 707.

$$I = \frac{\phi_0}{L_{SDA}} \quad (4)$$

where $L_{SDA}$ is inductance of the integrating inductor 707.

This operation means that the output result of the comparator is fed back to the input of integration. More specifically, an analog signal is integrated; the result of the integration is compared with the threshold value of the comparator; and then the result of the comparison is fed back to the integrator. As a result of the series of operation, sigma-delta modulation of the analog input signal is achieved.

Second Embodiment

Figure 8:
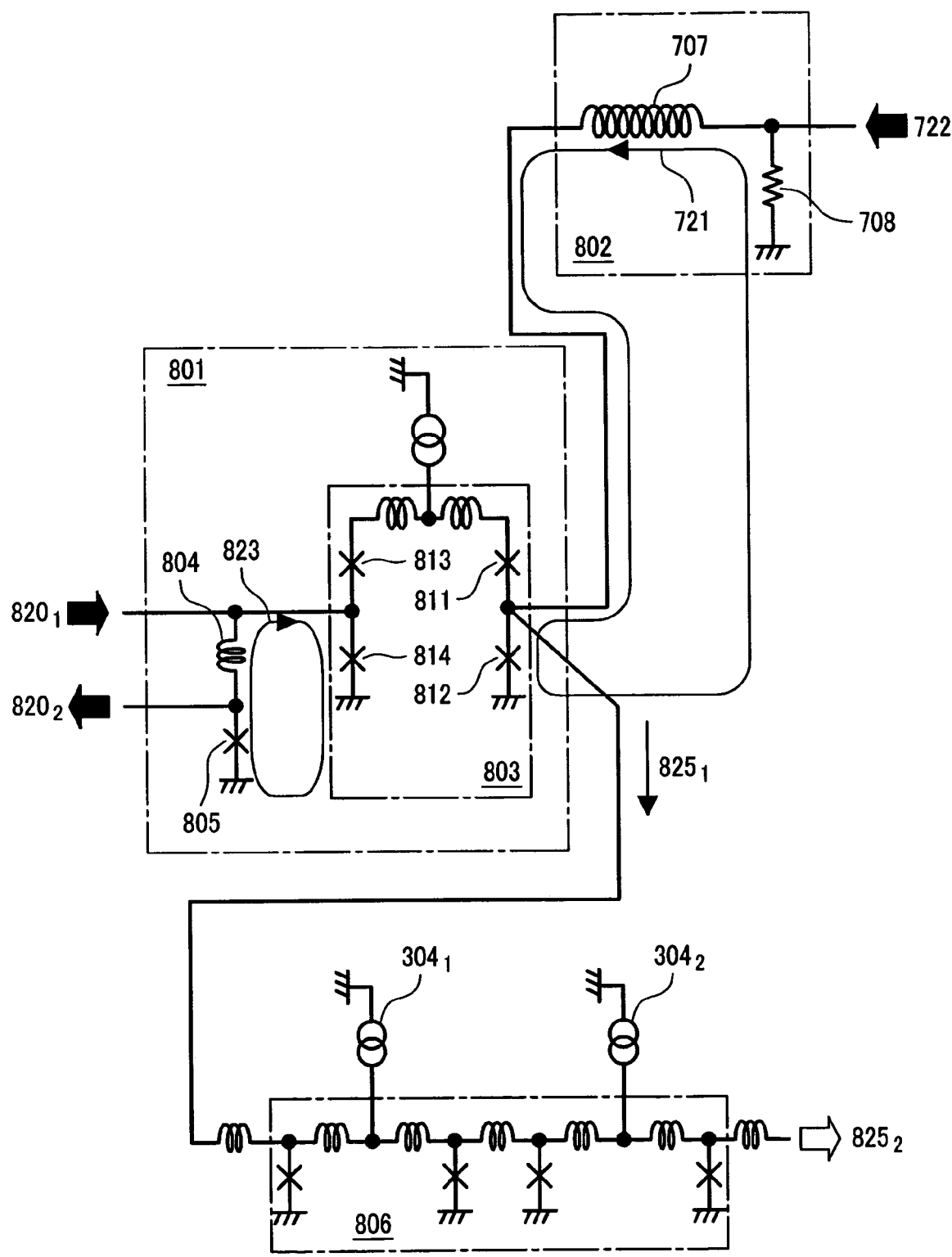
FIG. 8 is an equivalent circuit diagram illustrating a single flux quantum sigma-delta modulation circuit according to a second embodiment of the present invention.

A sigma-delta modulator is configured in a similar manner to that in the first embodiment. FIG. 8 is a diagram illustrating an equivalent circuit. This embodiment assumes that a modulation circuit includes a high-$T_c$ superconductor (HTS). With the objective of configuring a circuit that is suitable for the HTS, a current steering type single flux quantum circuit 801 is configured by changing part of the circuit configuration shown in FIG. 4B. First of all, a current clock signal 820 is directly inputted to pass through a quantizing inductor 804 as indicated with current clock signals $820_1$, $820_2$, instead of the magnetic couple of the input inductor 404 and the quantizing inductor 402 shown in FIG. 4B. This is because in the current HTS fabrication process, it is difficult to implement the magnetic couple of an inductor requiring three-layer structure in which two layers of superconductor are laminated to put a one-layer insulator therebetween. Moreover, as is the case with FIG. 4B, a four-junction balanced comparator, which is suitable for a SFQ circuit made by the HTS fabrication process, is used for the comparator 803. A SFQ data signal $825_1$ coming from the comparator propagates through a Josephson transmission line 806, and is then output as a SFQ data signal $825_2$. Here, the number of the bias current source 304 of the Josephson transmission line 806 is one for two junctions.

Operation of the equivalent circuit shown in FIG. 8 will be outlined below. A pair of junctions constituted of Josephson junctions 811 and 812 of the four-junction balanced comparator 803, and a pair of junctions constituted of Josephson junctions 813 and 814 of the four-junction balanced comparator 803, are connected in parallel to the bias current source through an inductor. If no electric current other than the bias current flows into each pair of junctions, each Josephson junction is in a zero-voltage state. One end of the quantizing inductor 804 is connected to a node between the pair of junctions constituted of the Josephson junctions 813 and 814. The quantizing junction 805 is connected to the quantizing inductor 804, and the current clock signal 820 is supplied to the quantizing inductor 804. The current clock signal 820 is integrated by the quantizing inductor 804 to cause the circular current 823 to flow. This circular current 823 is inputted from the node between the pair of junctions constituted of the Josephson junctions 813 and 814, and then flows through the Josephson junction 814 and the quantizing junction 805. On the other hand, an analog voltage signal 722 which is an analog signal to be converted is integrated by an analog-signal integration circuit 802 that is formed of an integrating inductor 707 and an integrator resistor 708. The result of the integration is reflected in a circular current 721 flowing through an integrating inductor 707. This circular current 721 is inputted, as a to-be-compared current, into the node between the pair of junctions constituted of the Josephson junctions 811 and 812 of the comparator 803 in the four-junction balanced comparator 803.

As is the case with the operation described with reference to FIG. 4B, at the rising edge of the current clock signal 820, the circular current 823 flows into the quantizing inductor 804, and consequently a SFQ pulse whose period coincides with that of the current clock signal 820 is supplied to the comparator 803. As a result, the Josephson junction 814 is switched, and thereby the SFQ pulse is supplied to the pair of junctions constituted of the Josephson junctions 811 and 812. At this time, if the circular current 721 of the analog-signal integration circuit 802, which is the to-be-compared current, does not exceeds a threshold value of the comparator 803, the Josephson junction 811 is switched, and consequently the SFQ data signal 825 is not output to an output terminal. On the other hand, if the circular current 721 exceeds the threshold value, the Josephson junction 812 is switched, which causes the SFQ data signal 825 to be output to the output terminal. If the SFQ data signal 825 is not output from the output terminal within a period of time that is equivalent to one period of the current clock signal 820, then the output is defined as digital data "0". If the SFQ data signal 825 is output, the output is defined as digital data "1". A SFQ data signal $825_1$ of the comparator 803 flows from the current steering type single flux quantum circuit 801, and passes through the Josephson transmission line 806, and is then obtained as a SFQ data signal $825_2$. In addition, at the falling edge of the current clock signal 820, the counter-clockwise circular current increases. However, because the quantizing junction 805 is switched, the circular current is lost, and the circuit returns to the initial state.

Figure 9A:
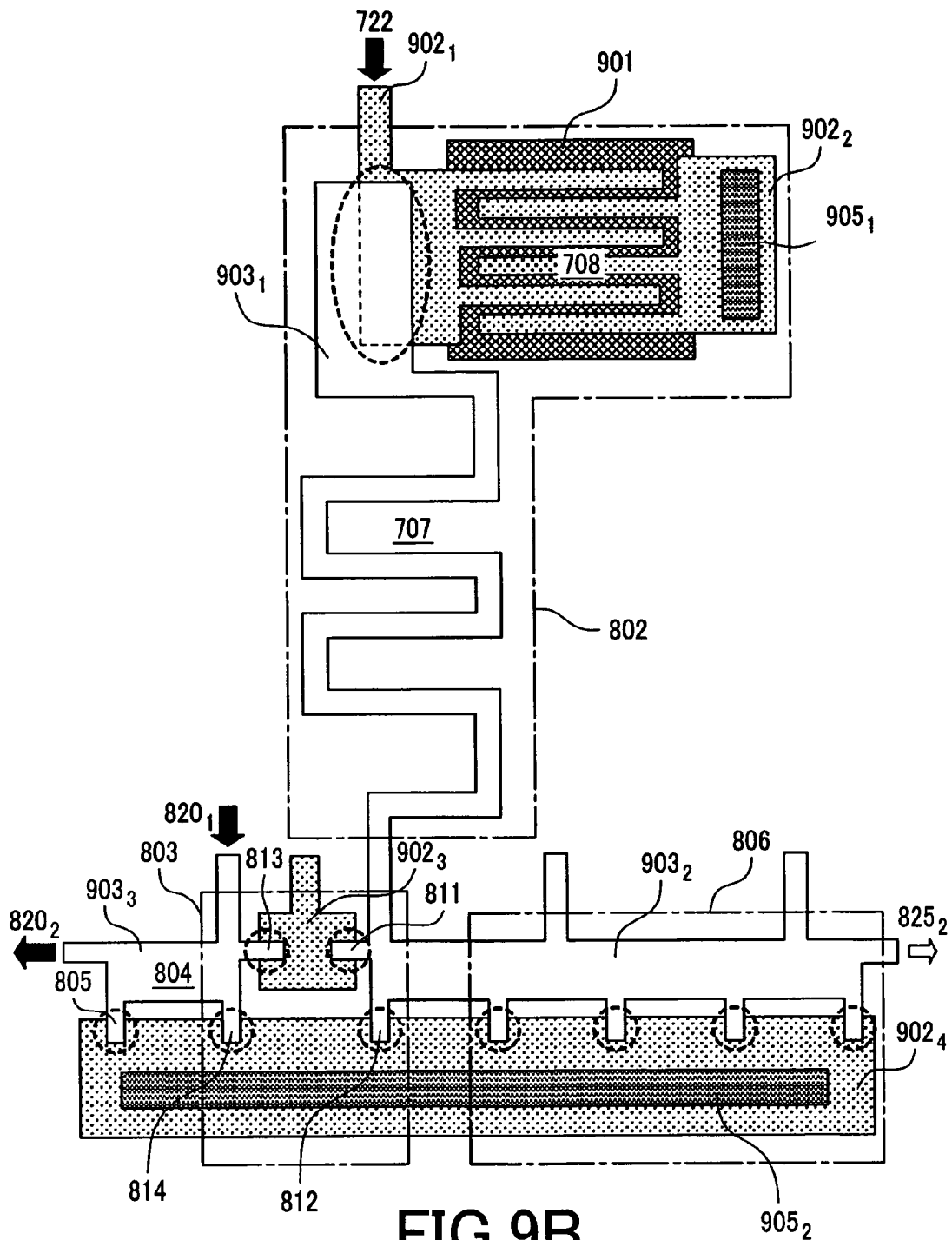
FIG. 9A is a layout illustrating a configuration of the second embodiment of the present invention
Figure 9B:
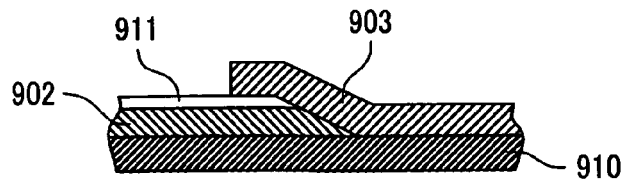
FIG. 9B is a cross section illustrating part of a Josephson junction.

FIG. 9A is a diagram illustrating an example of a circuit layout used to produce the sigma-delta modulator shown in FIG. 8 by use of a HTS production process. FIG. 9B is a diagram illustrating a cross section of a junction produced by the HTS process. A circuit is configured by forming, on a substrate 910, two layers of a base electrode layer 902 and a counter electrode layer 903 which are superconductive layers, and a resistive layer 901, so as to have a specified pattern. As shown in FIG. 9B, a Josephson junction is formed on a contact surface of a ramp edge which is structured in such a shape that the counter electrode layer 903 rides on the base electrode layer 902. Reference numeral 911 denotes an insulating layer. This insulating layer is provided to insulate the base electrode layer 902 from the counter electrode layer 903 that rides on it. A critical current value of the Josephson junction is determined by the line width of the counter electrode layer 903. In addition, by making the line width of the counter electrode layer 903 riding on the base electrode layer 902 sufficiently wide, a critical current value of the junction becomes sufficient for the electric current actually flowing, and thereby a contact (electrical resistance zero connection) between the base electrode layer 902 and the counter electrode layer 903 is formed.

In FIG. 9A, the resistor 708 is formed by interdigitally patterning the base electrode layers $902_1$, $902_2$ on a surface of the resistive layer 901. A value of resistance is determined by the length of respective portions of the base electrode layers $902_1$ and $902_2$ that are face each other, and also by the distance between the respective portions of the base electrode layers $902_1$ and $902_2$. A contact hole $905_1$ for grounding is formed at the edge of the base electrode layer $902_2$. At an edge of base electrode layer $902_1$, an edge of the counter electrode layer $903_1$ is formed so that the edge of the counter electrode layer $903_1$ ride on the edge of base electrode layer $902_1$. Here, as shown with broken lines, the counter electrode layer $903_1$ and the base electrode layer $902_1$ are formed as a Josephson junction having a long joining area. However, this Josephson junction has a critical current value that is sufficiently larger than the flowing electric current. For this reason, the part of the base electrode layer $902_1$ on which the counter electrode layer $903_1$ rides functions as a simple contact. The other edge of the counter electrode layer $903_1$ is meanderingly extended to form the integrating inductor 707. The extended edge of the integrating inductor 707 continues into a pattern of the counter electrode layer $903_2$ that becomes an inductor of the Josephson transmission line 806. At a position that is symmetrical to the pattern of the counter electrode layer $903_2$, the pattern of the counter electrode layer $903_3$ is provided. The latter pattern forms the quantizing inductor 804 of a circuit for converting a current clock 820 into a SFQ pulse. The pattern of the base electrode layer $902_3$ is provided between the pattern of the counter electrode layer $903_2$ and the pattern of the counter electrode layer $903_3$. The pattern of the base electrode layer $902_4$ is provided on an end face of the pattern of the counter electrode layer $903_2$ and on an end face of the pattern of the counter electrode layer $903_3$. The pattern of the base electrode layer $902_4$ is formed with a contact hole $905_2$ for grounding. As indicated by broken-line circles, the junction 811 is formed at a position between the pattern of the counter electrode layer $903_2$ and the base electrode layer $902_3$; and the junction 813 is formed at a position between the pattern of the counter electrode layer $903_3$ and the base electrode layer $902_3$. As indicated by broken-line circles, junctions 814, 805 are formed at positions between the pattern of the counter electrode layer $903_3$ and the base electrode layer $902_4$; a junction 812, and junctions to which no reference numeral is assigned, are formed at positions between the pattern of the counter electrode layer $903_2$ and the base electrode layer $902_4$.

As easily understood by making a comparison with FIG. 8, according to the layout shown in FIG. 9A, the equivalent circuit shown in FIG. 8 can be realized. Here, the base electrode layer $902_3$ and the counter electrode layer $903_3$ require patterning to be connected to the bias current source. However, because the figure becomes complicated, the patterning is omitted. In addition, paying attention to a critical current value of each junction, changing the line width of the counter electrode layer which rides on the base electrode layer suffices.

Figure 10:
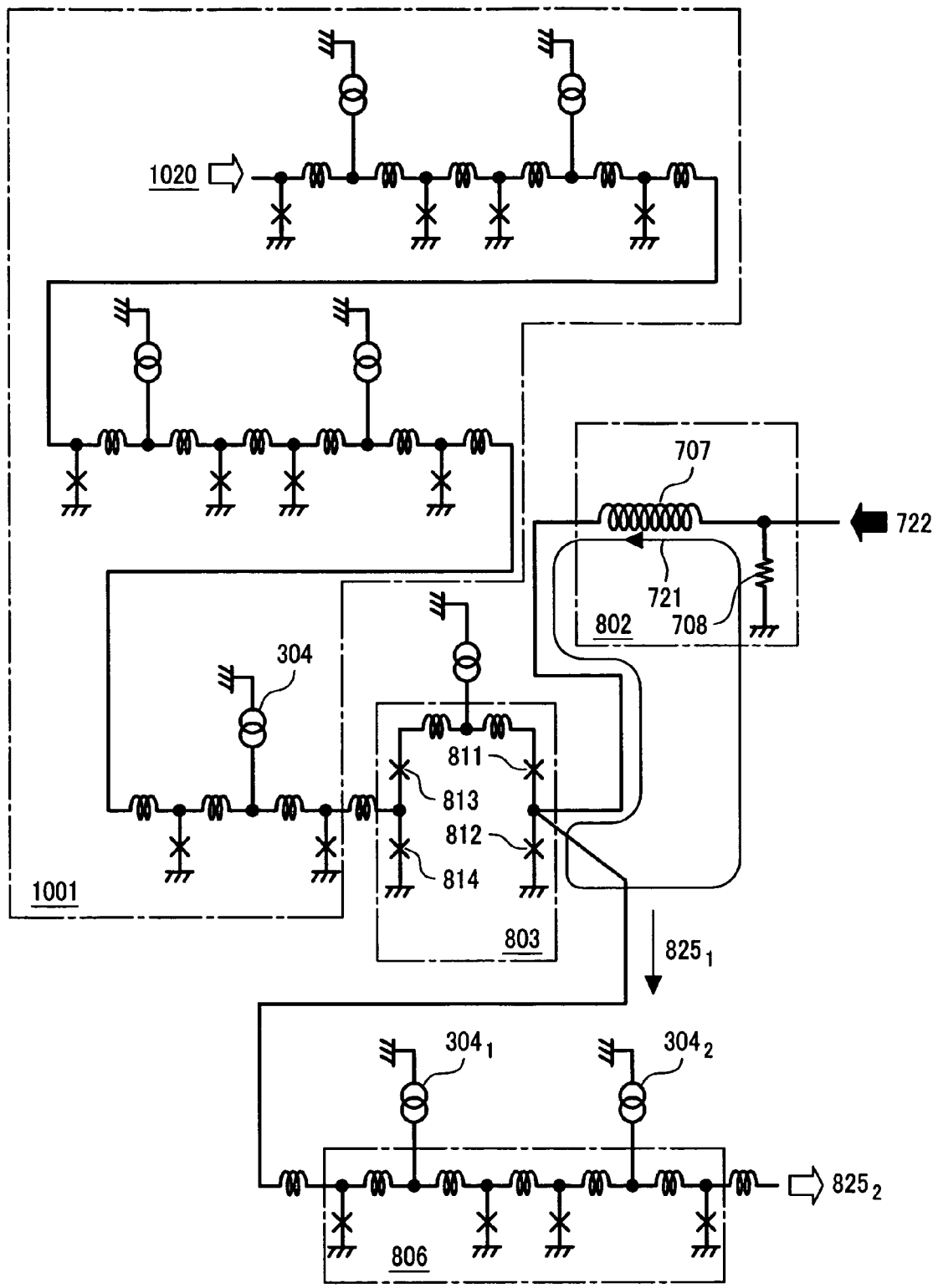
FIG. 10 is an equivalent circuit diagram illustrating a single flux quantum sigma-delta modulation circuit according to the prior art.

Next, the bit accuracy of the modulation circuit according to the second embodiment is evaluated by means of circuit simulation. In order to describe an effect of reducing the influence of clock jitter in the present invention, a comparison with the bit accuracy of the modulator configured according to the prior art is made. FIG. 10 is a diagram illustrating an example of the modulator that is configured according to the prior art. A SFQ clock signal 1020 including no clock jitter is propagated through a Josephson transmission line 1001 formed of ten Josephson junctions, and is then supplied to the four-junction balanced comparator 803. As apparent from the comparison between FIG. 8 and FIG. 10, the difference between them is only a method for forming a SFQ pulse to be supplied to the four-junction balanced comparator 803, and accordingly the others are the same.

In the circuit simulation, for both of the circuits, a sine wave whose peak value is 50% of full scale, and whose frequency is 60 MHz, is inputted as an analog signal. In addition, the frequency of a sampling clock signal is set at 40 GHz. It is assumed that the operating temperature is 4.2 K for an Nb superconductor circuit, and that the operating temperature is 20 K for the HTS. Thermal noises (4.2 K and 20 K) are added to all resistor components in the circuits. A spectrum of a data SFQ signal 825 output from the comparator 803 is acquired by the fast Fourier transform. Lastly, a ratio (signal-to-noise ratio) of the analog signal power in the spectrum to the noise power in a band (100 MHz) is determined. Further, the bit accuracy is evaluated by the undermentioned equation (5) indicating the relationship between the signal-to-noise ratio and the bit accuracy.

$$\text{Bit accuracy (bit)} = (\text{signal-to-noise ratio (dB)} - 1.76)/6.02 \quad (5)$$

Figure 11A:
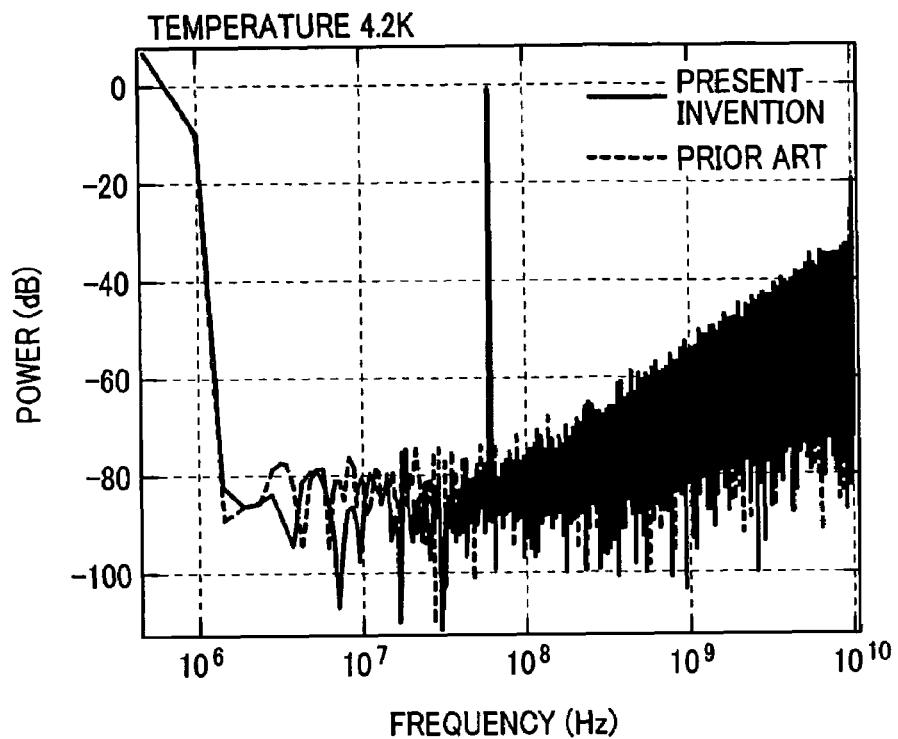
FIGS. 11A and 11B are diagrams each illustrating output spectra of single flux quantum sigma-delta modulation circuits according to the second embodiment of the present invention and the prior art.
Figure 11B:
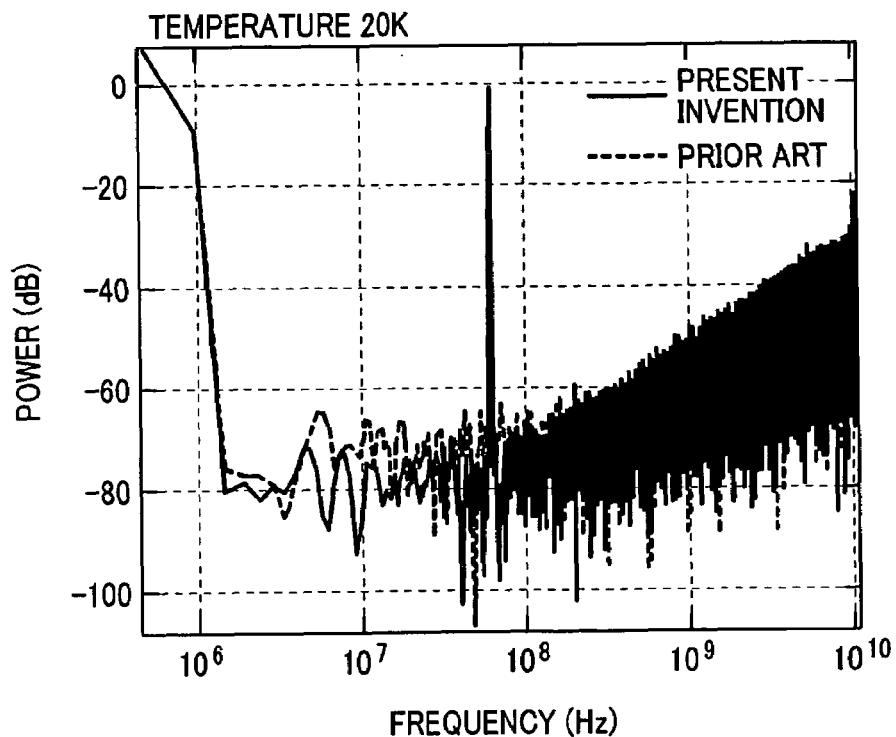

FIGS. 11A and 11B are diagrams each illustrating spectra of output data signals. FIG. 11A illustrates a spectrum of the modulator according to the prior art, and that of the modulator according to the present invention, at the operating temperature 4.2 K; and FIG. 11B illustrates a spectrum of the modulator according to the prior art, and that of the modulator according to the present invention, at the operating temperature 20 K. In the prior art, a signal-to-noise ratio of 58.3 dB is obtained at the operating temperature 4.2 K; and a signal-to-noise ratio of 49.3 dB is obtained at the operating temperature 20 K. On the other hand, according to the present invention, a signal-to-noise ratio of 60.7 dB is obtained at the operating temperature 4.2K; and a signal-to-noise ratio of 54.4 dB is obtained at the operating temperature 20 K.

Judging from the above result, it is found that using the present invention makes it possible to improve the signal-to-noise ratio by 2.4 dB at the operating temperature 4.2 K, and by 5.1 dB at the operating temperature 20 K. According to equation (5), if the accuracy is expressed in terms of the bit accuracy, it is possible to achieve an improvement in accuracy by 0.4 bit at the operating temperature 4.2 K, and by 0.8 bit at the operating temperature 20 K.

Third Embodiment

Figure 12A:
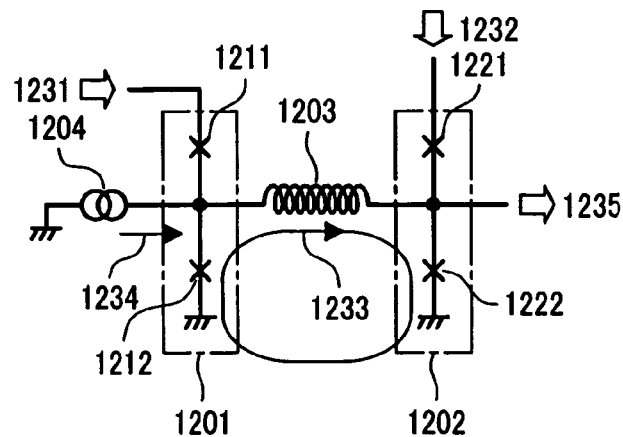
FIGS. 12A, 12B and 12C are equivalent circuit diagrams each illustrating a flip-flop circuit of a third embodiment to which a current steering type single flux quantum circuit according to the present invention is applied.

A description will be next made of an example in which a clock-signal input circuit that is proposed in the present invention is applied to a reset-set flip-flop (RS-FF) circuit which is one of sequential circuits. FIG. 12A is a diagram illustrating an example of a publicly known conventional RS-FF circuit. The RS-FF circuit comprises: two comparators 1201 and 1202, each of which is formed of a pair of Josephson junctions; one storage inductor 1203 that connects a node between the pair of junctions of the comparator 1201 to a node between the pair of junctions of the comparator 1202; and a bias current source 1204. A superconducting loop is constituted of: the Josephson junction 1212 forming the comparator 1201; the storage inductor 1203; and the Josephson junction 1222 forming the comparator 1202. Both of the comparators 1201, 1202 use as a to-be-compared current a circular current 1233 flowing through the superconducting loop. A bias current 1234 is added to the Josephson junction 1212 of the comparator 1201. However, if a direction of the circular current 1233 flowing into the comparator 1202 is positive, a direction of a circular current flowing into the Josephson junction 1212 is negative. Operation of the RS-FF circuit will be described below. Incidentally, although the bias current 1234 flows into the comparator 1202 through the storage inductor 1203, the amount of the bias current 1234 is substantially ignorable in comparison with the electric current flowing into the comparator 1201.

First of all, a state in which a SFQ is not stored in the superconducting loop is assumed. Because the circular current 1233 is not flowing, a to-be-compared current which is flowing into the comparator 1201 is only the bias current 1234, and its current value is set at a value that exceeds a threshold value of the comparator 1201.

If a SFQ set signal 1231 is inputted in this state, the junction 1212 is switched, and consequently a SFQ is stored in the superconducting loop. At the same time, the circular current 1233 is generated and flows into the comparators 1201, 1202. In the comparator 1201, a direction of the circular current is reverse to that of the bias current 1243. Accordingly, the to-be-compared current is smaller than the threshold value. On the other hand, the circular current flows into the comparator 1202, and accordingly the to-be-compared current in the comparator 1202 exceeds the threshold value. Therefore, if a SFQ reset signal 1232 is inputted, the junction 1222 is switched, which causes a data SFQ signal 1235 to be output. At the same time, the switching of the junction 1222 causes a SFQ in the superconducting loop to be lost. Accordingly, a value of the circular current 1233 becomes 0.

If the SFQ reset signal 1232 is inputted in a state in which no circular current flows, the to-be-compared current in the comparator 1202 is smaller than the threshold value, and accordingly the Josephson junction 1221 is switched. As a result, the data SFQ signal 1235 is not output. In addition, if the SFQ set signal 1231 is inputted in a state in which the circular current flows, the to-be-compared current in the comparator 1201 is also smaller than the threshold value. Accordingly, the Josephson junction 1211 is switched, which prevents an extra SFQ from being stored in the superconducting loop.

Figure 12B:
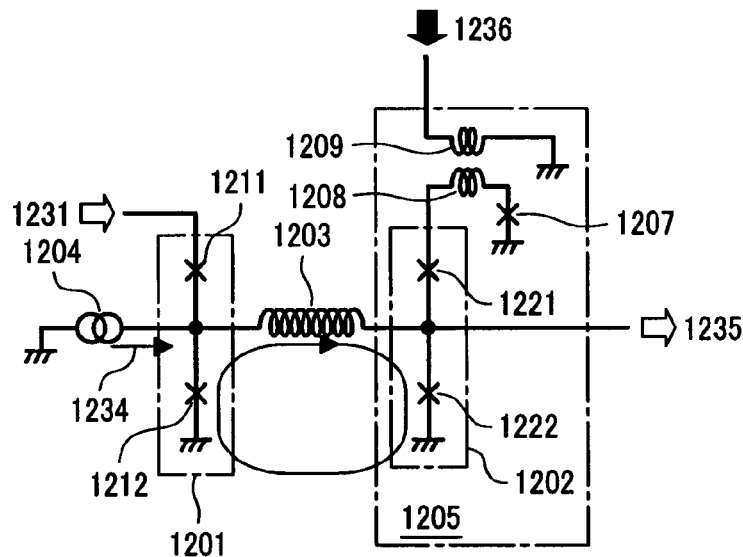

FIG. 12B is a diagram illustrating a circuit according to a third embodiment in which the present invention is applied to the above-mentioned RS-FF circuit. The third embodiment is configured by replacing the comparator 1202 on the reset side of the RS-FF circuit with a current steering type single flux quantum circuit 1205. As understood by comparing FIG. 12A with FIG. 12B, a point of difference with the conventional RS-FF circuit is that instead of the SFQ reset signal 1232, a current reset signal 1236 is used for the reset input. As described with reference to FIG. 4, the reset current signal 1236 flows into an input inductor 1209. As a result, a quantizing inductor 1208 and a quantizing junction 1207 generate a SFQ pulse in response to the rising edge of the reset current signal 1236. Therefore, it is possible to evaluate whether or not a SFQ exists in the superconducting loop. Because a Josephson transmission line is not used to propagate a reset signal into the circuit, it becomes possible to reduce the clock jitter.

Figure 12C:
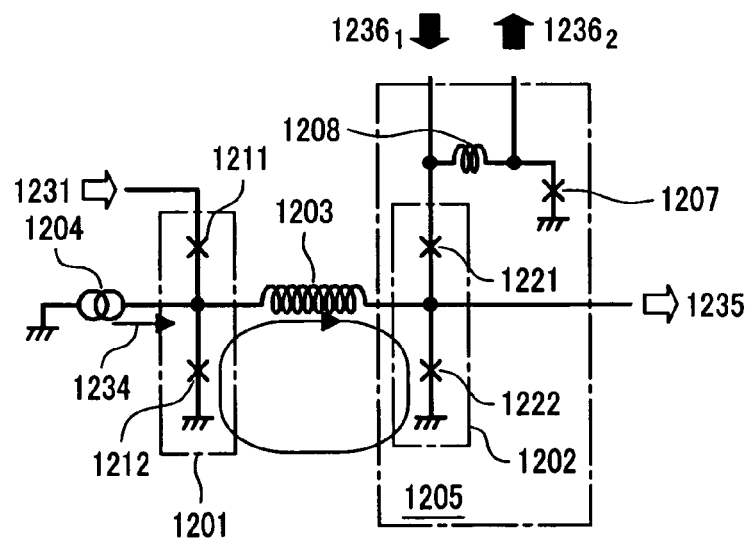

In the embodiment shown in FIG. 12B, the current reset signal 1236 is induced by the magnetic couple of the input inductor 1209 and the quantizing inductor 1208. On the other hand, FIG. 12C shows an example in which, as is the case with the current clock of the comparator 801 in FIG. 8, which has been induced without using a magnetic couple, the current reset signal 1236 is directly induced into the quantizing inductor 1208. With respect to the other points, the operation in the example shown in FIG. 12C is the same as that in the embodiment shown in FIG. 12B.

The present invention can also be applied to the set side of the RS-FF circuit. In this case, the comparator 1201 on the set side of the RS-FF circuit is replaced with a current steering type single flux quantum circuit. Then, at the rising edge of a current set signal, a SFQ is generated in the superconducting loop; and at the rising edge of a current reset signal, whether or not a SFQ exists in the circuit is evaluated. By using the current steering type single flux quantum circuit for both the set input side and reset input side of the RS-FF circuit, it becomes possible to evaluate the relationship between the time of arrival of a set current signal and that of a reset current signal with a high degree of accuracy without clock jitter.

Fourth Embodiment

Figure 13:
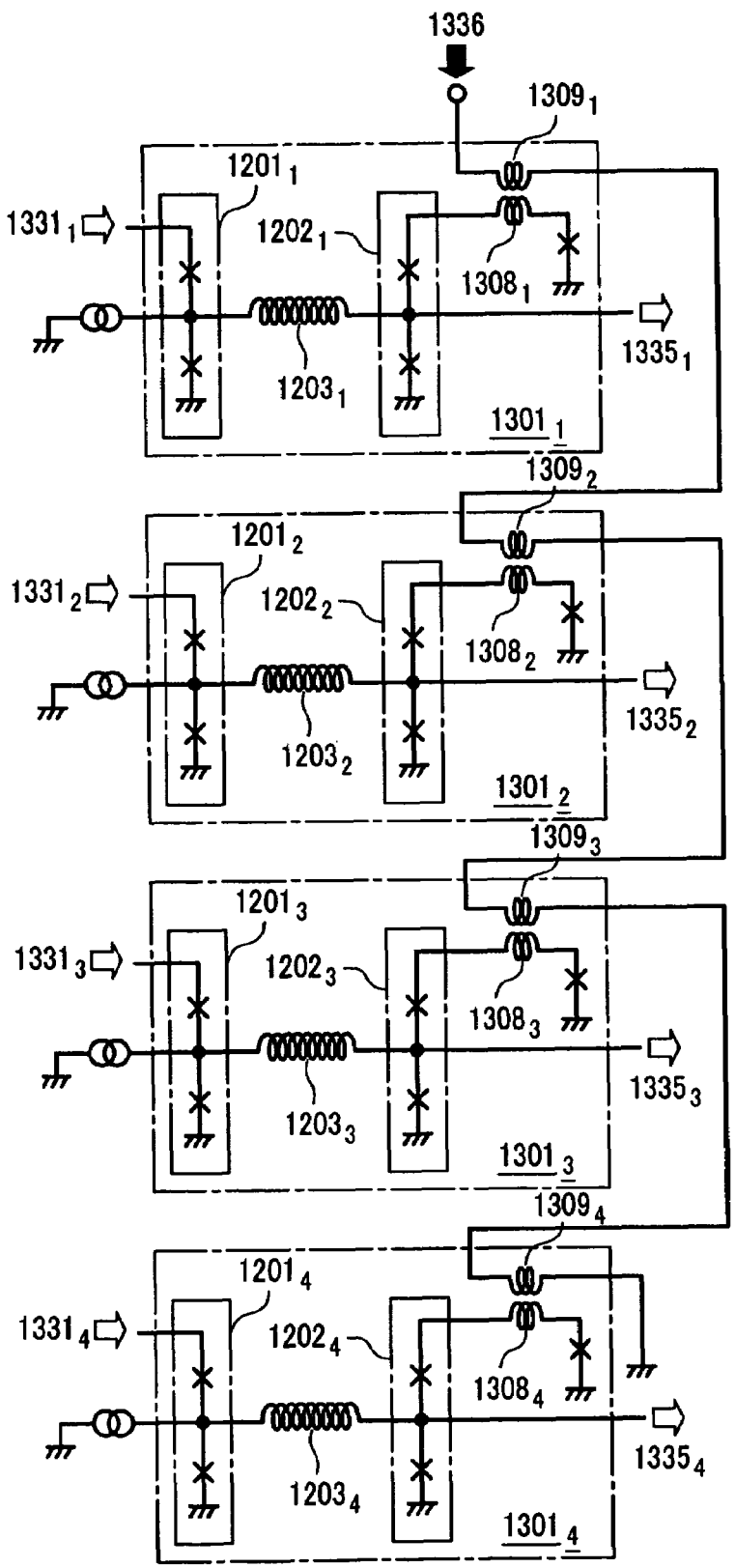
FIG. 13 is an equivalent circuit diagram illustrating a circuit of a fourth embodiment in which the flip-flop circuits according to the third embodiment of the present invention are connected in series.

A description will be made of a method for driving a plurality of SFQ function circuits by use of one clock signal source according to a fourth embodiment. As is the case with the third embodiment, RS-FF circuits are used as the SFQ function circuits. As shown in FIG. 13, four RS-FF circuits $1301_1$, $1301_2$, $1301_3$, and $1301_4$ are used. In the fourth embodiment, an input inductor 1309 of the current steering type single flux quantum circuit of each of the RS-FF circuits 1301 is connected to one another in series, and is then connected to a clock-signal input terminal. A current clock signal 1336 is induced into quantizing inductors $1308_1$ through $1308_4$ of the current steering type single flux quantum circuit of each of the RS-FF circuits. As a result, a SFQ is supplied to each comparator. If the number of RS-FF circuits is small and accordingly, the propagation delay of the current clock signal 1336 can be ignored, a change in current of the current clock signal is concurrently reflected in the circular current of the quantizing inductors $1308_1$ through $1308_4$ in the current steering type single flux quantum circuits of all RS-FF circuits. Therefore, it is possible to concurrently drive the RS-FF circuits. On the other hand, if the number of RS-FF circuits to be driven is large and accordingly, it is not possible to ignore the propagation delay between a current clock signal of the first RS-FF and that of the last RS-FF, the delay occurs in the drive timing even in the fourth embodiment. However, this delay differs from the clock jitter, and can be evaluated as the propagation delay. Therefore, by performing the circuit design with the delay on the RS-FF circuit side being taken into consideration, it is easy to avoid the influence of the delay.

Figure 14:
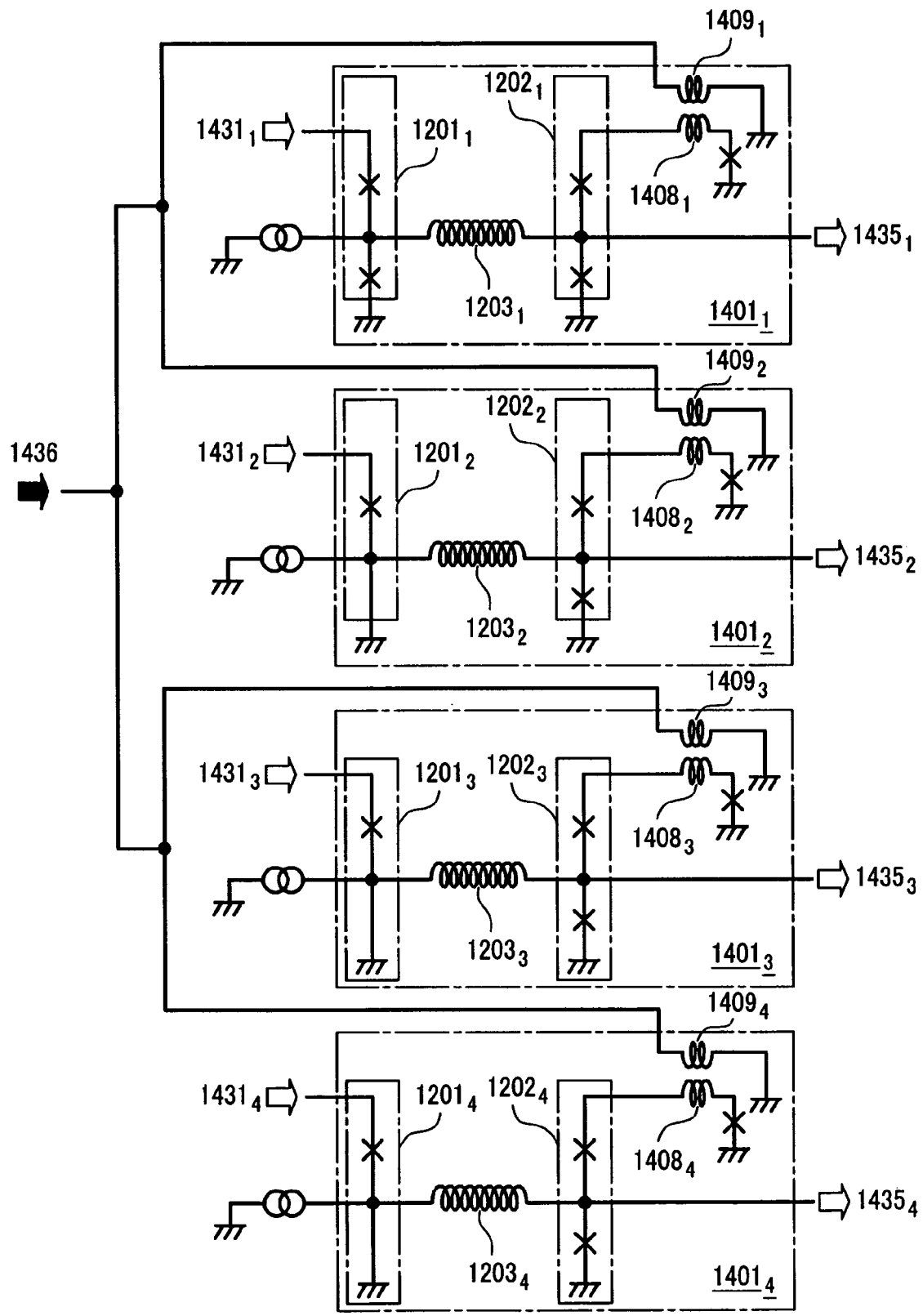
FIG. 14 is an equivalent circuit diagram illustrating a circuit of a fourth embodiment in which the flip-flop circuits according to the third embodiment of the present invention are connected in parallel.

Moreover, as shown in FIG. 14, even if the input inductors $1409_1$ through $1409_4$ of each SFQ function circuit are connected in parallel, it is possible to concurrently drive each RS-FF circuit 1401. In this case, the circuits are configured such that the wiring length from an input terminal for a current clock signal to each of the input inductors $1409_1$ through $1409_4$ becomes equivalent. This makes it possible to concurrently input an input clock signal 1436 into all of the input inductors $1409_1$ through $1409_4$, and thereby to concurrently induce the current clock signal 1436 into the quantizing inductor $1408_1$ through $1408_4$ of each RS-FF circuit so that a SFQ is concurrently supplied to each comparator.

In the prior art, for a plurality of RS-FF circuits, a clock signal propagating through a Josephson transmission line is derived from a splitter circuit that is formed in the middle of the Josephson transmission line. The clock signal is then supplied to each of the RS-FF circuits. As a result, the clock jitter occurring in the Josephson transmission line causes the arrival timing of a SFQ clock signal in each RS-FF circuit to fluctuate to the extent indicated by equation (1). For this reason, the time of arrival of the SFQ clock signal is accompanied by the delay that varies among the RS-FF circuits. Further, because the delay caused by the fluctuations fluctuates at every arrival of a SFQ clock signal, it is difficult to perform circuit design with the delay being taken into consideration. As a result, it is difficult to concurrently drive a plurality of RS-FF circuits.

Fifth Embodiment

Figure 15:
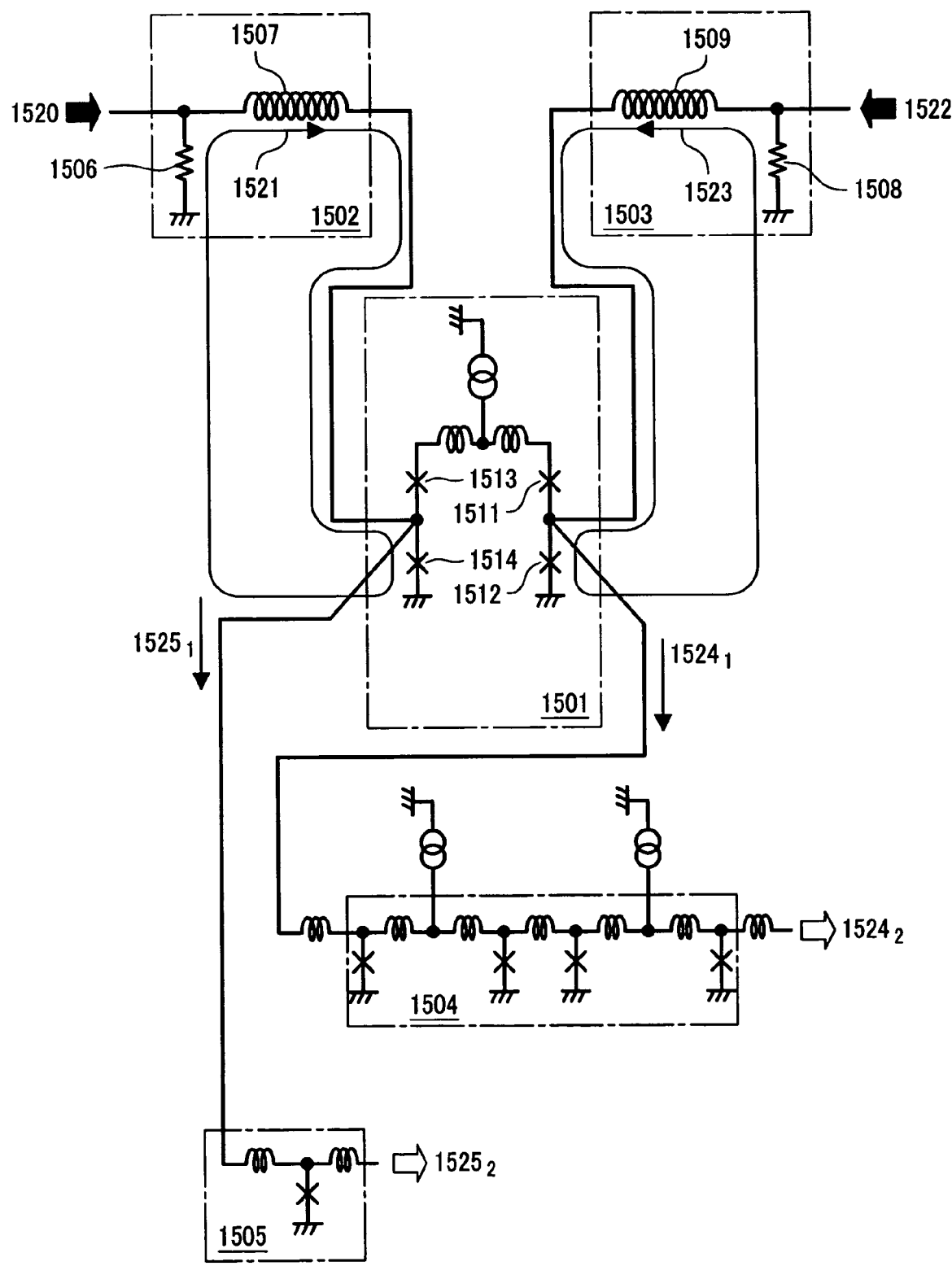
FIG. 15 is an equivalent circuit diagram illustrating a single flux quantum sigma-delta modulation circuit according to a fifth embodiment of the present invention.
Figure 16:
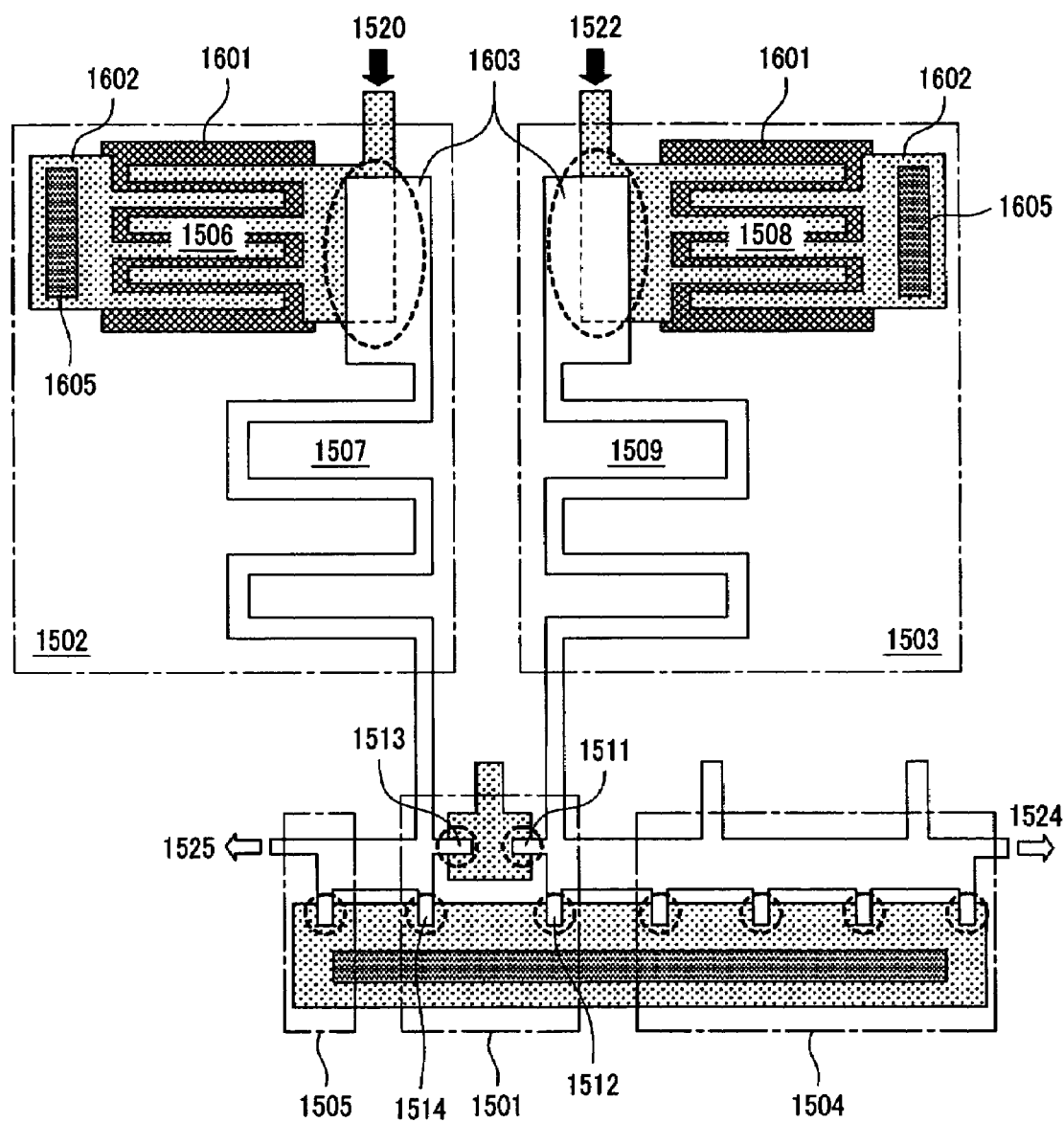
FIG. 16 is a layout illustrating a configuration of a single flux quantum sigma-delta modulation circuit according to the fifth embodiment of the present invention.

In a fifth embodiment, a clock signal oscillation circuit according to the present invention is applied to an oversampling sigma-delta modulator that is configured by a HTS fabrication process. FIG. 15 is a diagram illustrating an equivalent circuit; and FIG. 16 is a diagram illustrating a circuit layout. The circuit comprises: a DC voltage integration circuit 1502; a comparator 1501 that is formed of four Josephson junctions; a measured analog-signal integration circuit 1503; and Josephson transmission lines 1504, 1505 on the output side. A pair of junctions constituted of Josephson junctions 1511 and 1512 of the four-junction balanced comparator 1501, and a pair of junctions constituted of Josephson junctions 1513 and 1514 of the four-junction balanced comparator 1501, are connected in parallel to the bias current source through an inductor. If no electric current other than the bias current flows into each pair of junctions, each Josephson junction is in a zero-voltage state. A circular current 1521 supplied from a direct-current integration circuit 1502 flows into a node between the pair of junctions constituted of the Josephson junctions 1513 and 1514. A circular current 1523 supplied from the analog-signal integration circuit 1503 flows into a node between the pair of junctions constituted of the Josephson junctions 1511 and 1512.

Operation of a circuit will be described below. A specified DC voltage 1520 is integrated by the direct-current integration circuit 1502 that is formed of an integrator resistor 1506 and an integrating inductor 1507. The result of the integration is reflected in the circular current 1521 flowing through the integrating inductor 1507. The circular current 1521 then flows into the Josephson junction 1514 constituting the comparator 1501. In the integration process of the inputted DC voltage 1520, an integration value, namely, a level of the circular current 1521 increases. At a point of time when the circular current exceeds a critical current value of the Josephson junction 1514, the Josephson junction 1514 is switched. At this time, one SFQ is inputted into the comparator 1501. At the same time, as a result of this switching, a circular current equivalent to one SFQ is fed back to the DC voltage integration circuit 1502, and accordingly an integration value is decreased. Therefore, the integration operation of increasing the circular current and the switching operation of the junctions that decreases the circular current bring the circuit into a balanced state. Accordingly, a SFQ clock signal having a period T, which is expressed by equation (3), is supplied to the comparator 1501.

On the other hand, a to-be-measured analog signal 1522 is integrated by an analog-signal integration circuit 1503 that is formed of an integrating inductor 1509 and an integrator resistor 1508. The result of the integration is reflected in the circular current 1523 flowing through the integrating inductor 1509. This circular current 1523 is inputted into the comparator 1501 as a to-be-compared current. When the above-mentioned SFQ clock signal is inputted into the comparator 1501, if the circular current 1523 of the analog-signal integration circuit 1503, which is the to-be-compared current, does not exceeds a threshold value of the comparator 1501, the Josephson junction 1511 of the comparator is switched. As a result, the SFQ data signal 1524$_1$ is not output to an output terminal. On the other hand, if the circular current exceeds the threshold value, the Josephson junction 1512 is switched, which causes the SFQ data signal 1524$_1$ to be output. In addition, as a result of switching of the Josephson junction 1512, an electric current equivalent to one SFQ flows through the integrating inductor 1509 of the analog-signal integration circuit 1503, which causes the circular current 1523 of the integrating inductor to decrease. Sigma-delta modulation of an analog signal is achieved by this feedback operation.

Incidentally, a SFQ clock signal 1525$_1$ can be extracted from the Josephson transmission line 1505 as a signal 1525$_2$; and the SFQ data clock signal 1524$_1$ can be extracted from the Josephson transmission line 1504 as a signal 1524$_2$. Therefore, it is possible to transmit, through the same Josephson transmission line, modulation data to circuits at subsequent stages including signal processing. If the SFQ data signal is not output from the output terminal within a period of time that is equivalent to one period of the SFQ clock signal, then the output is defined as digital data "0", whereas if the SFQ data signal is output, the output is defined as digital data "1". If the SFQ clock signal and the SFQ data signal are transmitted through the Josephson transmission lines 1504, 1505, there is concern that the transmission of the signals will exert an influence upon the conversion accuracy of clock jitter. However, sampled digital signals do not influence the conversion accuracy so long as the amount of clock jitter is half of a sampling period (several tens of picoseconds) or less.

A circuit layout shown in FIG. 16 is based on the HTS production process. As is the case with the second embodiment described with reference to FIG. 9, this circuit layout is configured such that two layers of a base electrode layer and a counter electrode layer which are superconductive layers, and a resistive layer, are formed on a substrate. As described with reference to FIG. 9B, a Josephson junction is formed on a ramp edge which is structured in such a shape that a counter electrode layer rides on a base electrode layer. A critical current value of the Josephson junction is determined by the line width of the counter electrode layer. In addition, by making the line width of the counter electrode layer riding on the base electrode layer sufficiently wide so that an electric current sufficient for a critical current value of a junction may flow, a contact between the base electrode layer and the counter electrode layer is formed.

Because it is possible to easily understand the circuit layout shown in FIG. 16 by contrasting it with the circuit layout in FIG. 9, reference numerals of the circuit elements shown in FIG. 15 are merely provided and the description thereof will be omitted here.

According to the present invention, in a single flux quantum circuit that uses a flux quantum as an information carrier, it is not necessary to use a Josephson transmission line for a SFQ function circuit that forms the circuit. Therefore, it is possible to operate a SFQ function circuit with a clock signal containing no or minimized clock jitter.

Reference numerals used in the drawings of this specification are listed as follows:
101 Semiconductor oscillator
102 SFQ circuit
103 dc/SFQ converter
104 Josephson transmission lines
105 Splitter circuit
106 SFQ function circuit
110 Current clock signal
111 SFQ clock signal
121 Bias current source
122 Input inductor
123 Josephson junction
124 Josephson junction
125 Inductor
126 Circular current
127 Circular current
128 Node
200 Ring oscillator circuit
201 dc/SFQ converter
202 Josephson transmission line
203 Josephson transmission line
204 Confluence buffer
205 Splitter circuit
206 Josephson transmission line
207 Splitter circuit
208 SFQ function circuit
220 Current trigger signal
221 SFQ trigger signal
222 SFQ clock signal
301 Josephson junction
302 Inductor
303 Unit circuit
304 Bias current source
305 Bias voltage source
306 Bias resistor
307 Splitter circuit 320 SFQ signal
401 Comparator
402 Quantizing inductor
403 Quantizing junction
404 Input inductor
405 Bias current source
411 Josephson junction
412 Josephson junction
420 Current clock signal
421 To-be-compared current
422 SFQ data signal
423 Circular current
424 Circular current
431 The other end of a pair of junctions
432 Node
501 Integrating inductor
502 Integrator resistor
503 Integration circuit
504 Quantizing junction
505 Bias current source
520 DC voltage
521 Circular current
522 Bias current
523 SFQ signal
601 Integrating inductor
602 Integrator resistor
603 Integration circuit
604 Comparator
606 Bias current source
611 Josephson junction
612 Josephson junction
632 Node
620 DC voltage
621 Circular current
622 Bias current
624 To-be-compared current
625 SFQ data signal
701 Current steering type single flux quantum circuit
702 Analog-signal integration circuit
703 Comparator
707 Analog-signal integrating inductor
708 Analog-signal integrator resistor
720 Current clock signal
722 Analog signal
723 SFQ data signal
801 Current steering type single flux quantum circuit
802 Analog-signal integration circuit
803 Four-junction balanced comparator
804 Quantizing inductor
805 Quantizing junction
806 Josephson transmission line
811 Josephson junction
812 Josephson junction
813 Josephson junction
814 Josephson junction
820 Current clock signal
823 Circular current
825 SFQ data signal
901 Resistor
902 Base electrode layer
903 Counter electrode layer
905 Contact hole for grounding
910 Substrate
911 Insulating layer
1001 Josephson transmission line
1020 SFQ clock signal
1201 Comparator
1202 Comparator
1203 Storage inductor
1204 Bias current source
1211 Josephson junction
1212 Josephson junction
1221 Josephson junction
1222 Josephson junction
1231 SFQ set signal
1232 SFQ reset signal
1233 Circular current
1234 Bias current
1235 SFQ data signal
1205 Current steering type single flux quantum circuit
1207 Quantizing junction
1208 Quantizing inductor
1209 Input inductor
1236 Current reset signal
1301 RS-FF circuit
1308 Quantizing inductor
1309 Input inductor
1331 SFQ data signal
1335 SFQ data signal
1336 Current reset signal
1401 RS-FF circuit
1408 Quantizing inductor
1409 Input inductor
1431 SFQ data signal
1435 SFQ data signal
1436 Current reset signal
1501 Four-junction balanced comparator
1502 DC voltage integration circuit
1503 Analog-signal integration circuit
1504 Josephson transmission line
1505 Josephson transmission line
1506 Integrator resistor
1507 Integrating inductor
1508 Integrator resistor
1509 Integrating inductor
1511 Josephson junction
1512 Josephson junction
1523 Josephson junction
1514 Josephson junction
1520 DC voltage
1521 Circular current
1522 Analog signal
1523 Circular current
1524 SFQ data signal
1525 SFQ clock signal

What is claimed is:

1. A current steering type single flux quantum circuit comprising:
a pair of junctions constituted of two Josephson junctions that are connected in series to each other;
a circuit for grounding one end of the pair of junctions;
a bias current supply which has one end which is grounded and the other end which is connected to the other end of the pair of junctions;
a series circuit formed of a first inductor and a third Josephson junction, said series circuit being connected between the ground and a node between the pair of junctions and the bias current supply; and
a second inductor that is magnetically coupled to the first inductor;
wherein an analog signal to-be-compared current is inputted into a node between the two Josephson junctions constituting the pair of junctions, and when an electric current flowing into the first inductor exceeds a specified threshold value as a result of being induced by a current signal flowing into the second inductor, if said analog signal to-be-compared current exceeds a specified threshold value, a single flux quantum signal is output from the node between the two Josephson junctions constituting the pair of junctions.

2. The current steering type single flux quantum circuit according to claim 1, wherein:
   instead of using the series circuit formed of the first inductor and the third Josephson junction, said series circuit being connected between the ground and the node that connects the pair of junctions to the bias current source, and instead of using the second inductor that is magnetically coupled to the first inductor, said current steering type single flux quantum circuit comprises a series circuit formed of the first inductor having one end which is connected to the other end of the pair of junctions, and the third Josephson junction having one end which is grounded; and
   a specified current signal is allowed to flow from a node between the first inductor and the pair of junctions to a node between the first inductor and the third Josephson junction.

3. The current steering type single flux quantum circuit according to claim 1, wherein:
   instead of using the series circuit formed of the first inductor and the third Josephson junction, said series circuit being connected between the ground and the node that connects the pair of junctions to the bias current source, and instead of using the second inductor that is magnetically coupled to the first inductor, said current steering type single flux quantum circuit comprises a series circuit formed of an inductor having one end which is connected to the other end of the pair of junctions, and a resistor having one end which is grounded; and
   a specified DC voltage is applied to a node between the inductor and the resistor that form the series circuit.

4. The current steering type single flux quantum circuit according to claim 1, wherein:
   an analog signal current to be compared which is inputted into a node between the two Josephson junctions constituting the pair of junctions is determined by an analog voltage applied to a node between an integrating inductor and an integrator resistor that form a series circuit, one end of said integrating inductor being connected to the node between the two Josephson junctions constituting the pair of junctions, and one end of said integrator resistor being grounded.

* * * * *